United States Patent
Tajima et al.

(10) Patent No.: US 10,649,118 B2
(45) Date of Patent: May 12, 2020

(54) IMAGING DEVICE

(71) Applicant: Hitachi, Ltd., Tokyo (JP)

(72) Inventors: Kazuyuki Tajima, Tokyo (JP); Takeshi Shimano, Tokyo (JP); Takeru Utsugi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/335,290

(22) PCT Filed: May 17, 2017

(86) PCT No.: PCT/JP2017/018578
§ 371 (c)(1),
(2) Date: Mar. 21, 2019

(87) PCT Pub. No.: WO2018/055831
PCT Pub. Date: Mar. 29, 2018

(65) Prior Publication Data
US 2019/0278006 A1    Sep. 12, 2019

(30) Foreign Application Priority Data

Sep. 26, 2016  (JP) ................................. 2016-186695

(51) Int. Cl.
*G02B 5/18*    (2006.01)
*H04N 5/225*   (2006.01)
(Continued)

(52) U.S. Cl.
CPC ............ *G02B 5/1842* (2013.01); *G02B 5/18* (2013.01); *G02B 5/1871* (2013.01); *G02B 13/00* (2013.01);
(Continued)

(58) Field of Classification Search
CPC .... H04N 5/225; H04N 5/2253; H04N 5/2254; H04N 5/238; H01L 27/146; G02B 5/18;
(Continued)

(56) References Cited

U.S. PATENT DOCUMENTS 5,710,667 A    1/1998  Goto
5,978,139 A *  11/1999 Hatakoshi .............. B82Y 10/00
                                                    359/19
(Continued)

FOREIGN PATENT DOCUMENTS

JP    07-270677 A    10/1995
JP    2015-115527 A   6/2015

OTHER PUBLICATIONS

International Search Report of PCT/JP2017/018578 dated Oct. 17, 2017.

*Primary Examiner* — Lin Ye
*Assistant Examiner* — Chriss S Yoder, III
(74) *Attorney, Agent, or Firm* — Mattingly & Malur, PC

(57) ABSTRACT

This imaging device comprises: an image sensor which converts an optical image, captured by pixels arranged in an array on an imaging surface, into an image signal and outputs the image signal; a modulation unit which is provided to a light-receiving surface of the image sensor and modulates the intensity of light; and an image processing unit which carries out image processing on an output image output by the image sensor. The modulation unit has a grating substrate and a first grating pattern formed on a first surface of the grating substrate facing a surface of the image sensor near the light-receiving surface. The grating pattern is configured from a plurality of concentric circles having pitches which are inversely proportional to the distance from
(Continued)

(a) FRONT SURFACE GRATING (b) BACK SURFACE GRATING the origin point of at least one reference coordinate, the concentric circles do not overlap with each other within the grating pattern.

20 Claims, 24 Drawing Sheets

(51) Int. Cl.
    *G02F 1/1343*     (2006.01)
    *H04N 5/238*     (2006.01)
    *G02B 13/00*     (2006.01)
    *H01L 27/146*     (2006.01)

(52) U.S. Cl.
    CPC .... *G02F 1/13439* (2013.01); *G02F 1/134309* (2013.01); *H01L 27/146* (2013.01); *H04N 5/225* (2013.01); *H04N 5/2253* (2013.01); *H04N 5/2254* (2013.01); *H04N 5/238* (2013.01); *G02F 2201/122* (2013.01)

(58) Field of Classification Search
CPC .... G02B 5/1842; G02B 5/1871; G02B 13/00; G02F 1/134309; G02F 1/13439; G02F 2201/122
See application file for complete search history.

(56) References Cited

U.S. PATENT DOCUMENTS

| | | | |
|---|---|---|---|
| 7,067,784 B1* | 6/2006 | Lowans | G02B 26/0808 250/201.5 |
| 2009/0250594 A1* | 10/2009 | Tanaka | G02B 5/201 250/208.1 |
| 2014/0253781 A1 | 9/2014 | Gill et al. | |
| 2015/0219808 A1 | 8/2015 | Gill et al. | |

* cited by examiner (a) FRONT SURFACE GRATING (b) BACK SURFACE GRATING

IMAGING DEVICE

TECHNICAL FIELD

The present invention relates to an imaging device, and particularly relates to an imaging device for improving resolution of the imaging device using a diffraction grating substrate.

BACKGROUND ART

In a camera mounted on a smartphone, etc. or an in-vehicle camera requiring 360° sensing, it is necessary to reduce a thickness. There has been a proposed device that performs imaging by analyzing an optical image penetrating a diffraction grating substrate without using a lens.

For example, Patent Document 1 describes a method of obtaining an image of an outer object by attaching a specific diffraction grating substrate to an image sensor and obtaining an incidence angle of incident light from a projection pattern generated on a sensor by light penetrating the diffraction grating substrate using inverse problem calculation without using a lens.

In addition, Patent Document 2 describes that a concentric circular grating pattern whose pitch becomes finer from a center toward an outside is used as a diffraction grating substrate.

CITATION LIST

Patent Document

Patent Document 1: US 2014/0253781 A
Patent Document 2: US 2015/0219808 A

SUMMARY OF THE INVENTION

Problems to be Solved by the Invention

In Patent Document 1, a pattern of a diffraction grating formed on an upper surface of the substrate attached to the image sensor is a specific grating pattern such as a spiral shape, and there is a problem that calculation for solving an inverse problem for reproducing an image from a projection pattern received by the sensor becomes complicated.

In Patent Document 2, since a diffraction grating in which a plurality of concentric circular grating patterns overlap each other is used, there is concern that a penetration ratio decreases, and mutual concentric circular grating patterns interfere with each other to cause a noise increase in a reproduced image.

In this regard, there has been a proposed imaging device for obtaining a captured image by including a plurality of concentric circles whose pitch is inversely proportional to a distance from an origin point in front and back diffraction grating patterns of a double-sided grating substrate to generate a moire fringe, Fourier-transforming a captured image, and analyzing a spatial frequency spectrum by focusing on the moire fringe.

According to this technology, it is easy to detect an incidence angle of a light beam, and it is possible to provide an imaging device having less interference noise of a pattern of a diffraction grating.

However, according to this imaging device, to detect an incidence angle of a light beam, it is necessary to shift front and back diffraction grating patterns with respect to the grating substrate, and create peaks of a spatial frequency at two positions (details will be described below), which leads to a decrease in resolution in imaging.

The invention has been made to solve the above-mentioned problem, and an object thereof is to improve a resolution of an imaging device having arranged therein a diffraction grating substrate that includes a plurality of concentric circles whose pitch is inversely proportional to a distance from an origin point.

Solutions to Problems

To solve the above-mentioned problem, a configuration of an imaging device of the invention includes an image sensor that converts an optical image captured by a plurality of pixels arranged in an array on an imaging surface into an image signal and outputs the converted image signal, a modulation unit provided on a light-receiving surface of the image sensor to modulate an intensity of light, and an image processing unit that performs image processing on an output image output from the image sensor, in which the modulation unit has a grating substrate, and a first grating pattern formed on a first surface of the grating substrate facing a surface close to the light-receiving surface of the image sensor, the grating pattern includes a plurality of concentric circles whose pitches are inversely proportional to a distance from an origin point of at least one set of reference coordinates, the plurality of concentric circles does not overlap each other within the grating pattern, and the reference coordinates are symmetrically disposed with respect to a normal line at a center of the light-receiving surface.

Effects of the Invention

According to the invention, it is possible to improve a resolution of an imaging device having arranged therein a diffraction grating substrate that includes a plurality of concentric circles whose pitch is inversely proportional to a distance from an origin point.

MODE FOR CARRYING OUT THE INVENTION

[Configuration of Imaging Device Using Double-Sided Grating Substrate]

First, a description will be given of an outline of an imaging device using a double-sided grating substrate and image processing with reference to FIG. 1 and FIG. 2.

Figure 1:
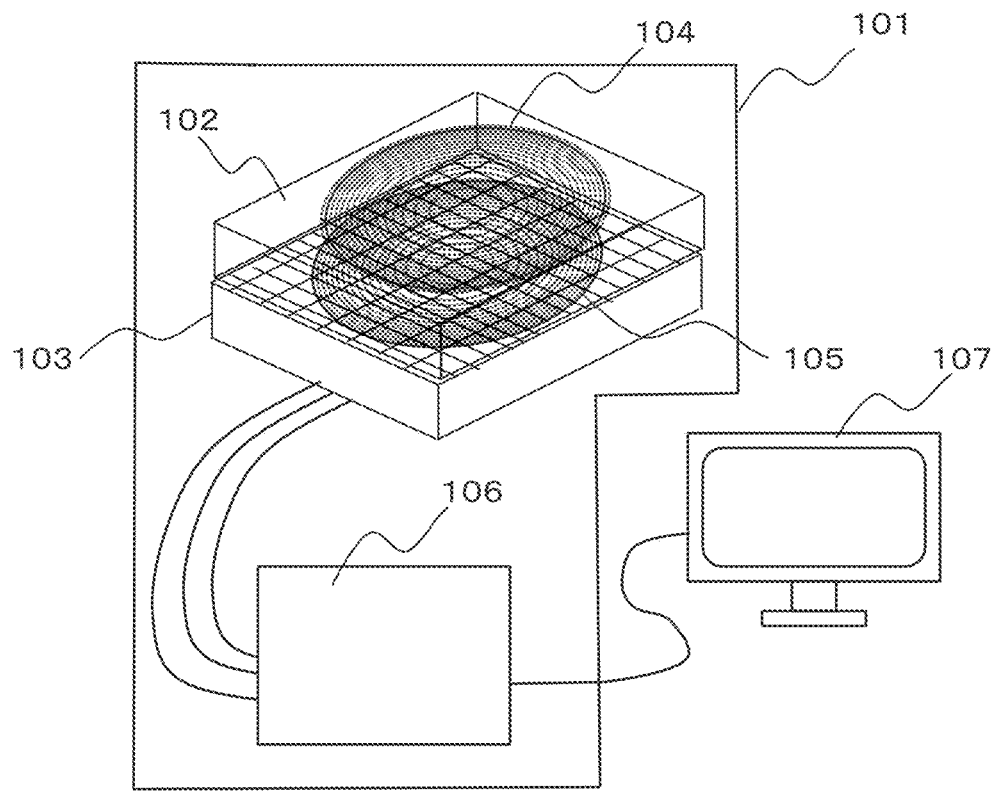
FIG. 1 is a configuration diagram of an imaging device using a grating pattern.

FIG. 1 is a configuration diagram of an imaging device using a grating pattern.

Figure 2:
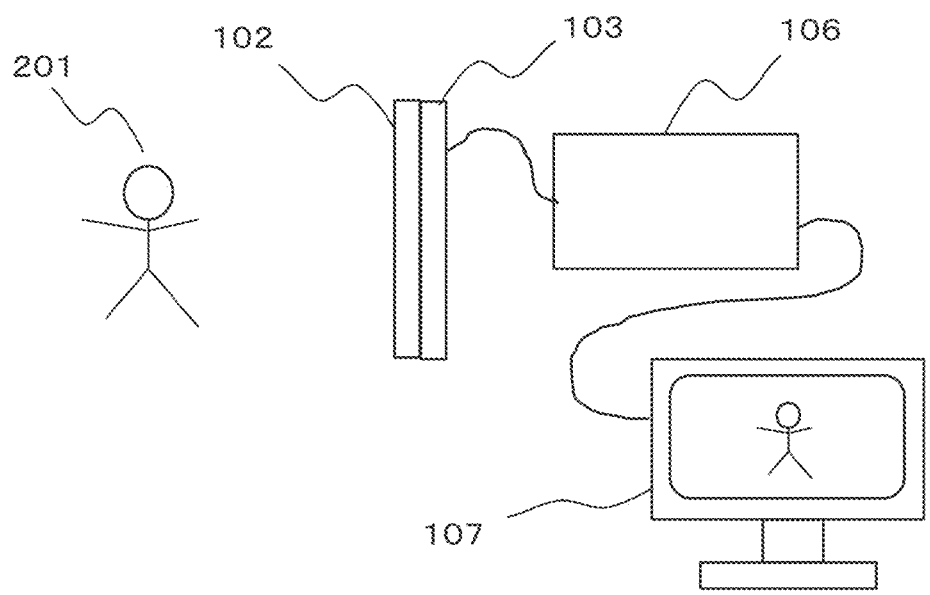
FIG. 2 is a diagram illustrating a state of being displayed on a monitor display by the imaging device.

FIG. 2 is a diagram illustrating a state of being displayed on a monitor display by the imaging device.

Figure 3:
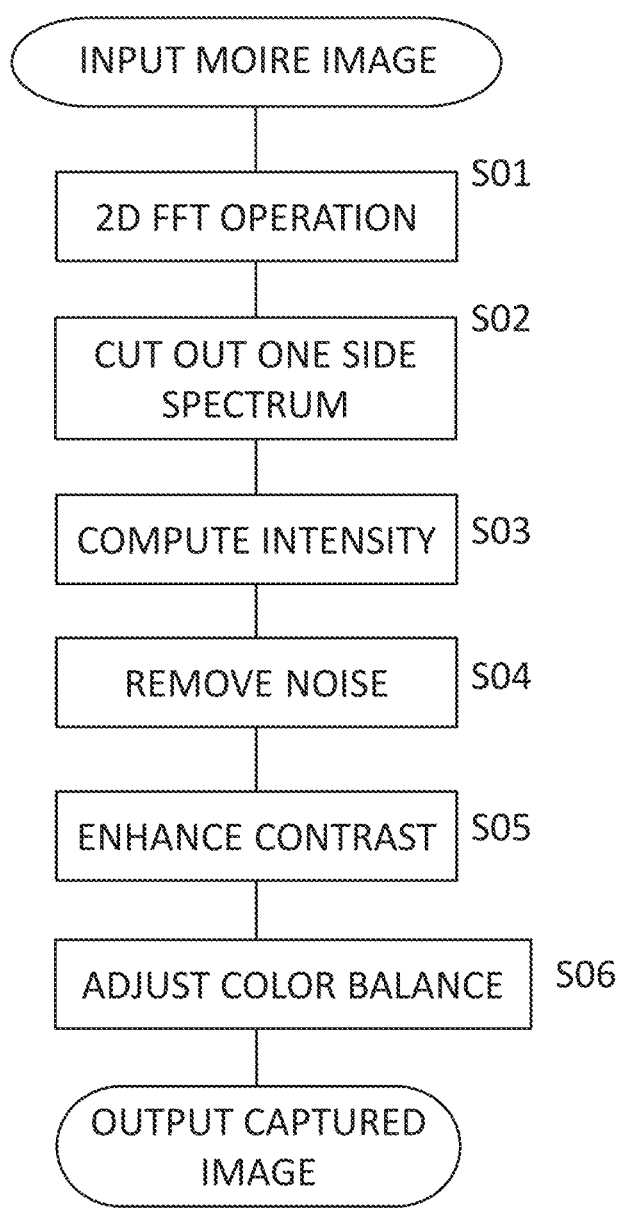
FIG. 3 is a flowchart illustrating processing of an image processing circuit.

FIG. 3 is a flowchart illustrating processing of an image processing circuit.

An imaging device 101 includes a double-sided grating substrate 102, an image sensor 103, and an image processing circuit 106. The double-sided grating substrate 102 is in close contact with and fixed to a light-receiving surface of the image sensor 103, and a concentric circular front side grating pattern 104 whose (grating interval) pitch is inversely proportional to a radius from a center, that is, whose (grating interval) pitch narrows outward in proportion to the radius from the center is formed on a front surface of the double-sided grating substrate 102. In addition, a similar back side grating pattern 105 is formed on a surface in contact with the light-receiving surface of the image sensor 103 corresponding to a back surface. The intensity of light penetrating these grating patterns is modulated by the grating patterns. The penetrating light is received by the image sensor 103, and an image signal thereof is image-processed by the image processing circuit 106 and output to a monitor display 107, etc. A normal imaging device requires a lens for forming an image in front of the sensor. However, in this imaging device, it is possible to acquire an image of an outer object without requiring a lens. In this instance, the concentric circular grating pattern 104 has no other grating pattern intersecting each ring pattern included in concentric circles on the same internal surface, and it is possible to suppress a decrease in light utilization efficiency without unnecessary interference occurring between grating patterns.

A state of display by the imaging device is illustrated in FIG. 2 and can be obtained by photographing a subject 201 with a grating surface of the double-sided grating substrate 102 directly facing the subject 201, performing image output processing on light received by the image sensor, and outputting an output thereof to the monitor display 107.

A flow of image processing in the image processing circuit 106 is illustrated in FIG. 3. Two-dimensional (2D) FFT operation is performed on an input moire fringe image for each of R, G and B components of a color (S01) to obtain a frequency spectrum. Data of one side frequency is cut out (S02), and intensity computation is performed (S03). Further, noise removal (S04), contrast enhancement processing (S05), etc. are performed on an obtained image, a color balance is adjusted (S06), and the image is output as a captured image.

[Principle of Imaging of Imaging Device Using Double-Sided Grating Substrate]

Next, a description will be given of a principle of imaging of the imaging device illustrated in FIG. 1 with reference to FIG. 4 to FIG. 8.

Figure 4:
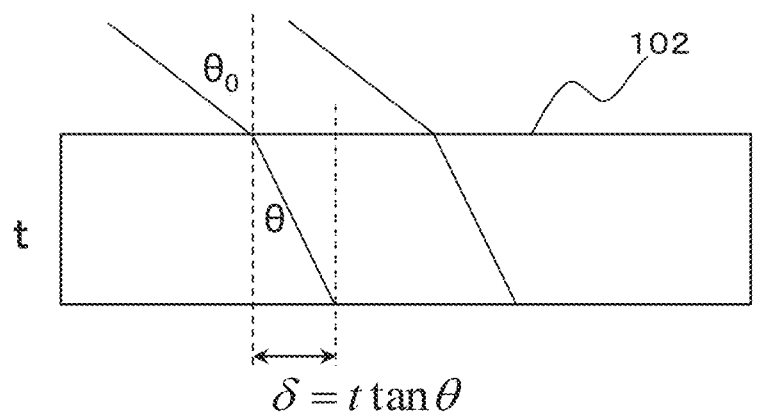
FIG. 4 is a diagram describing that a projection image from a front surface to a back surface of a grating substrate due to obliquely incident parallel light causes in-plane shift.

FIG. 4 is a diagram describing that a projection image from a front surface to a back surface of a grating substrate due to obliquely incident parallel light causes in-plane shift.

Figure 5:
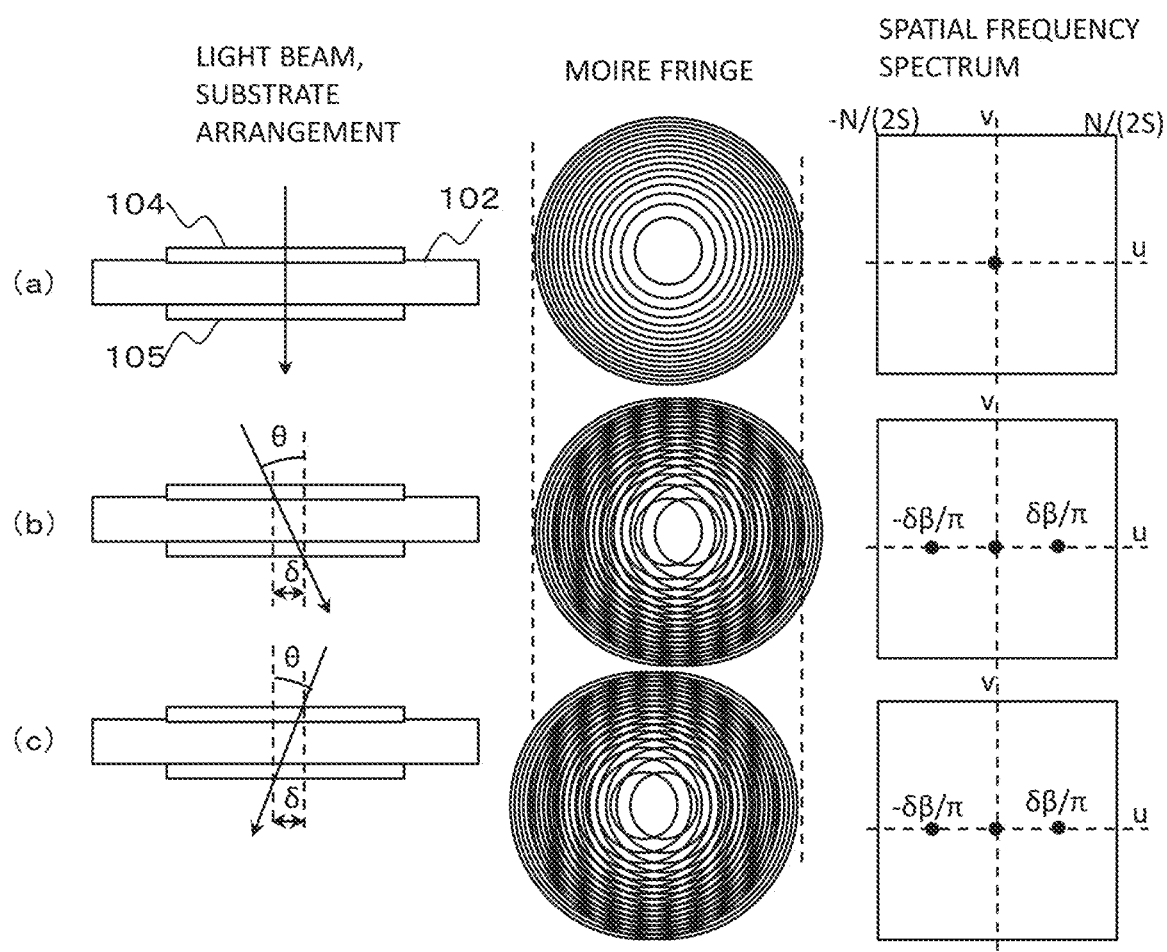
FIG. 5 is a schematic view describing generation of a moire fringe and a frequency spectrum in a case in which axes of gratings of both surfaces of the grating substrate are aligned.

FIG. 5 is a schematic view describing generation of a moire fringe and a frequency spectrum in a case in which axes of gratings of both surfaces of the grating substrate are aligned.

Figure 6:
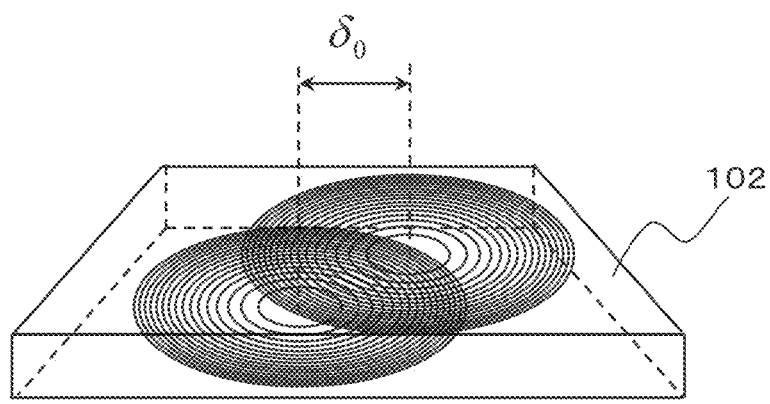
FIG. 6 is a schematic view of a case in which axes of a front surface grating and a back surface grating are disposed to be shifted from each other.

FIG. 6 is a schematic view of a case in which axes of a front surface grating and a back surface grating are disposed to be shifted from each other.

Figure 7:
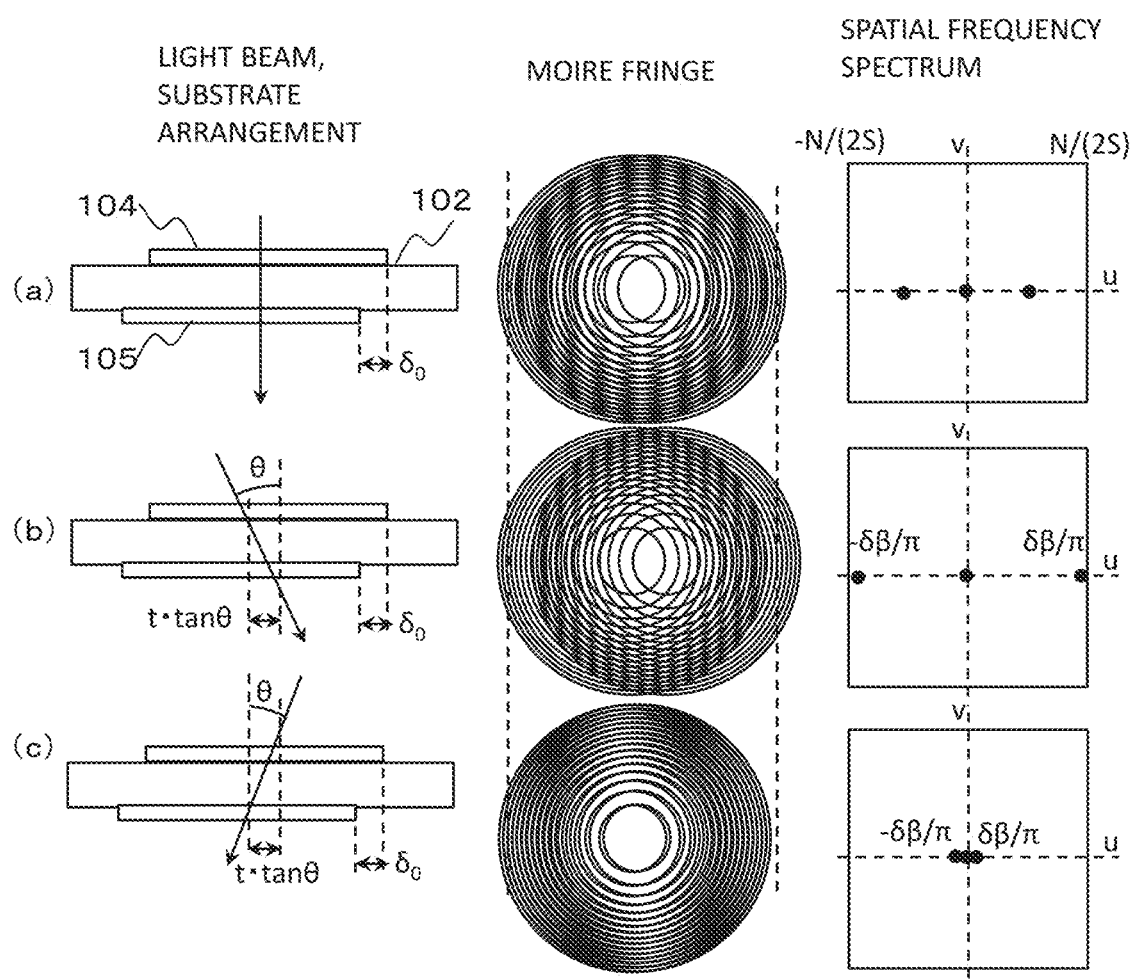
FIG. 7 is a schematic view describing generation of a moire fringe and a frequency spectrum in a case in which the gratings of the both surfaces of the grating substrate are shifted from each other.

FIG. 7 is a schematic view describing generation of a moire fringe and a frequency spectrum in a case in which the gratings of the both surfaces of the grating substrate are shifted from each other.

Figure 8:
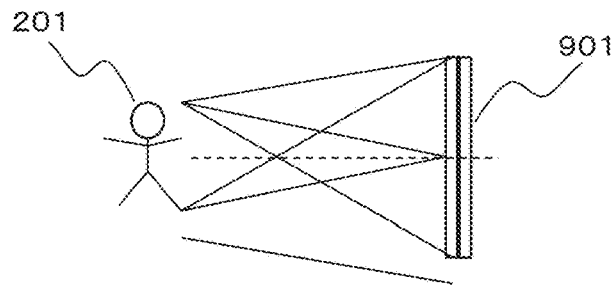
FIG. 8 is a diagram describing an angle formed by light from each point included in an object with respect to a sensor.

FIG. 8 is a diagram describing an angle formed by light from each point included in an object with respect to a sensor.

First, a grating pattern of the concentric circular grating pattern 104 whose (grating interval) pitch is inversely proportional to the radius from the center, that is, whose (grating interval) pitch narrows outward in proportion to the radius from the center is defined as below.

In a laser interferometer, etc., a case in which a spherical wave close to a plane wave and a plane wave used as reference light interfere with each other is presumed. When a center of concentric circles is set as reference coordinates, a radius from the reference coordinates is set to r, and a phase of the spherical wave at the radius is set to $\phi(r)$, $\phi(r)$ is expressed as below using a coefficient $\beta$ which determines a magnitude of a curvature of the wave surface.

[Formula 1]

$$\phi(r)=\beta r^2 \quad (1)$$

A square of the radius r is expressed despite the spherical wave since approximation can be performed only by a lowest order of an expansion due to the spherical wave close to the plane wave. When the plane wave interferes with light having this phase distribution, an intensity distribution of an interference fringe below is obtained.

[Formula 2]

$$I(r) = \frac{1}{4}|\exp i\phi(r) + 1|^2 = \frac{1}{2}(1 + \cos\phi) \quad (2)$$
$$= \frac{1}{2}(1 + \cos\beta r^2)$$

The intensity distribution corresponds to a fringe of concentric circles having a bright line at a radial position satisfying the following formula.

[Formula 3]

$$\phi(r)=\beta r^2=2n\pi(n=0,1,2,\ldots) \quad (3)$$

When a pitch of the fringe is set to p,

[Formula 4]

$$p\frac{d}{dr}\phi(r) = 2p\beta r = 2\pi \quad (4)$$
$$p(r) = \frac{\pi}{\beta r}$$

is obtained, and it is understood that the pitch narrows in proportion to the radius. Such a fringe is referred to as a Fresnel zone plate. A grating pattern having a penetration ratio distribution proportional to the intensity distribution defined in this way is used as the grating patterns 104 and 105 illustrated in FIG. 1. When it is presumed that parallel light is incident on a substrate of a thickness t having such a grating formed on both surfaces at an angle $\theta_0$ as illustrated in FIG. 4, if a retraction angle in the substrate is set to $\theta$, light geometrically optically multiplied by a penetration ratio of the grating of the front surface is incident on the back surface to shift by $\delta = t \cdot \tan\theta$. When it is presumed that centers of two concentric circle gratings are aligned, multiplication is performed with a penetration ratio of the grating of the back surface shifted by $\delta$. In this instance, the following intensity distribution is obtained.

[Formula 5]

$$I(x,y)I(x+\delta,y) = \frac{1}{4}\{1+\cos\beta(x^2+y^2)\}\{1+\cos\beta((x+\delta)^2+y^2)\} = \quad (5)$$
$$\frac{1}{8}\{2+4\cos\beta(r^2+\delta x)\cos\delta\beta x + \cos 2\beta(r^2+\delta x) + \cos 2\beta\delta x\}$$

It is understood that a fourth term of this expansion creates straight fringe patterns at equal intervals on an overlapped area in a direction of shift of the two gratings. A fringe generated with a relatively low spatial frequency due to overlap of a fringe and a fringe is referred to as a moire fringe. Such straight fringes at equal intervals produce a sharp peak in the spatial frequency distribution obtained by 2D Fourier transform of the detected image. Then, it is possible to obtain a value of $\delta$, that is, an incidence angle $\theta$ of a light beam from a value of the frequency. It is obvious that moire fringes uniformly obtained at equal intervals on such an entire surface are generated at the same pitch regardless of a shift direction due to symmetry of concentric circular grating arrangement. It is considered that such a fringe is obtained since the grating pattern is formed by the Fresnel zone plate, and uniform fringes on the entire surface may not be obtained by other grating patterns. It is understood that a fringe obtained by modulating intensity of a Fresnel zone plate by a moire fringe is generated in a second term. However, a frequency spectrum of a product of two fringes is a convolution of respective Fourier spectrums, and thus a sharp peak is not obtained. When only a component having a sharp peak is extracted from Formula (5) as the following formula,

[Formula 6]

$$I(x,y)=\frac{1}{8}(2+\cos 2\delta\beta x) \quad (6)$$

a Fourier spectrum thereof is as below.

[Formula 7]

$$F[I(x,y)] = \quad (7)$$
$$\frac{1}{8}F[2+\cos 2\delta\beta x] = \frac{1}{4}\delta(u,v) + \frac{1}{8}\delta\left(u+\frac{\delta\beta}{\pi},v\right) + \frac{1}{8}\delta\left(u-\frac{\delta\beta}{\pi},v\right)$$

Here, F denotes a Fourier transform operation, u and v denote spatial frequency coordinates in x and y directions, and $\delta$ having parentheses denotes a Dirac delta function. From this result, it is understood that in a spatial frequency spectrum of a detected image, a peak of a spatial frequency of a moire fringe occurs at a position of $u=\pm\delta\beta/\pi$.

A correspondence between a light beam and substrate arrangement, a generated moire fringe, and a spatial frequency spectrum is illustrated in FIG. 5. From the left, FIG. 5 corresponds to an arrangement diagram of the light beam and the substrate, and schematic views of the moire fringe and the spatial frequency spectrum. FIG. 5(*a*) corresponds to vertical incidence, FIG. 5(*b*) corresponds to a case in which the light beam is incident from the left at an angle θ, and FIG. 5(c) corresponds to a case in which the light beam is incident from the right at the angle θ. The front side grating pattern 104 and the back side grating pattern 105 on the double-sided grating substrate 102 are aligned with each other. In the case of FIG. 5(a), shadows of a front side grating and a back side grating coincide with each other, and thus a moire fringe is not generated. In the cases of FIG. 5(b) and FIG. 5(c), since shifts of the front side grating and the back side grating are equal to each other, the same moire is generated, peak positions of spatial frequency spectrums coincide with each other, and it becomes impossible to distinguish whether an incidence angle of a light beam corresponds to FIG. 5(b) or FIG. 5(c) from the spatial frequency spectrum.

To avoid this fact, as illustrated in FIG. 6, two gratings need to be relatively shifted with respect to an optical axis in advance such that shadows of the two gratings are shifted and overlapped with respect to a light beam vertically incident on the substrate. When a relative shift of the shadows of the two gratings with respect to a vertical incident plane wave on the axis is set to $\delta_0$, a shift δ caused by the plane wave of the incident angle θ is expressed by the following formula.

[Formula 8]

$$\delta = \delta_0 + t \tan \theta \quad (8)$$

In this instance, on a plus side of the frequency, a peak of the spatial frequency spectrum of the moire fringe of the light beam having the incident angle θ corresponds to the following position.

[Formula 9]

$$u = \frac{\delta \beta}{\pi} = \frac{1}{\pi}(\delta_0 + t \tan \theta)\beta \quad (9)$$

When a size of the image sensor is set to S, and the number of pixels in each of the x and y directions is set to N, a spatial frequency spectrum of a discrete image by the fast Fourier transform (FFT) is obtained in a range from $-N/(2S)$ to $+N/(2S)$. Thus, considering that light of the incident angle on the plus side and light of the incidence angle on the minus side are equally received, it is reasonable to set a spectral peak position of a moire fringe by the vertical incident plane wave (θ=0) to a center position between the origin point (DC) and, for example, a frequency position on the + side end, that is, to a spatial frequency position of the following formula.

[Formula 10]

$$\frac{1}{\pi}\delta_0 \beta = \frac{N}{4S} \quad (10)$$

Therefore, it is reasonable to set a relative center position shift of the two gratings to the following formula.

[Formula 11]

$$\delta_0 = \frac{\pi N}{4\beta S} \quad (11)$$

In a case in which the front side grating pattern 104 and the back side grating pattern 105 are shifted in this way, a correspondence between a light beam and substrate arrangement, a generated moire fringe, and a spatial frequency spectrum is illustrated in FIG. 7. Similarly to FIG. 5, an arrangement diagram of the light beam and the substrate is illustrated on the left side, the moire fringe is illustrated in a center column, and the spatial frequency spectrum is illustrated on the right side. FIG. 7(a) corresponds to a case in which the light beam is vertically incident, FIG. 7(b) corresponds to a case in which the light beam is incident from the left at an angle θ, and FIG. 7(c) corresponds to a case in which the light beam is incident from the right at the angle θ. Since the front side grating pattern 104 and the back side grating pattern 105 are disposed to be shifted by $\beta_0$ in advance, even in the case of FIG. 7(a), the moire fringe is generated, and a peak appears in the spatial frequency spectrum. As described above, the shift amount $\delta_0$ is set such that the peak position appears at a center of a spectrum range on one side from the origin point. In this instance, the shift δ becomes larger in FIG. 7(b) and becomes smaller in FIG. 7(c). Thus, unlike FIG. 5, a difference in incidence angle between FIG. 7(b) and FIG. 7(c) can be distinguished from the peak position of the spectrum. A spectral image of this peak is a bright point indicating a light flux of infinity, which is nothing but a captured image by this imaging device.

Here, when a maximum angle of the incidence angle of parallel light that can be received is set to $\theta_{max}$, from

[Formula 12]

$$u_{max} = \frac{1}{\pi}(\delta_0 + t \tan \theta_{max})\beta = \frac{N}{2S}, \quad (12)$$

a maximum angle of view that can be received by this imaging device is given as follows.

[Formula 13]

$$\tan \theta_{max} = \frac{\pi N}{4t\beta S} \quad (13)$$

From analogy with image formation using a normal lens, when considering that parallel light of the angle of view $\theta_{max}$ is received by focusing at an end of the sensor, it is possible to consider that an effective focal length of an imaging optical system of this device not using any lens corresponds to the following formula.

[Formula 14]

$$f_{eff} = \frac{S}{2\tan \theta_{max}} = \frac{2\beta t S^2}{\pi N} \quad (14)$$

It is presumed that a penetration ratio distribution of gratings basically has a sinusoidal characteristic as shown by Formula (2). However, when such a component is present as a fundamental frequency component of the grating, it is conceivable to binarize the penetration ratio of the grating, change duties of a grating region having a high penetration ratio and a region having a low penetration ratio, and widen a width of the region having the high penetration ratio, thereby increasing the penetration ratio.

In the above description, in any case, incident rays simultaneously correspond to only one incidence angle. However, in order for this device to actually function as a camera, a case in which light rays of a plurality of incidence angles are simultaneously incident needs to be presumed. Such light rays of a plurality of incidence angles previously overlap images of a plurality of front side gratings at the time of incidence on the back surface side grating. When these light rays mutually generate moire fringes, there is concern of becoming noise that hinders detection of a moire fringe with the back surface grating corresponding to a signal component. However, in practice, overlap of images of the front side grating does not cause a peak of the moire image, and only overlap with the back surface side grating causes a peak. A reason therefor will be described below. First, it is a great difference that overlap of shadows of the front side grating by light beams of a plurality of incidence angles is not a product but a sum with respect to respective light intensities. In overlap of the shadow of the front side grating and the back side grating by light of one incidence angle, a light intensity distribution after penetrating the back side grating is obtained by multiplying the penetration ratio of the back side grating by an intensity distribution of light corresponding to a shadow on the front side. On the other hand, overlap of shadows by a plurality of light rays having different angles incident on the front side grating corresponds to overlap of light rays, and thus is not a product but a sum. In the case of the sum, a distribution is obtained by multiplying a distribution of moire fringes by a distribution of gratings of an original Fresnel zone plate as in the following formula.

[Formula 15]

$$I(x, y) + I(x+\delta, y) = \frac{1}{2}\{1 + \cos\beta(x^2 + y^2)\} + \frac{1}{2}\{1 + \cos\beta((x+\delta)^2 + y^2)\}$$
$$= 1 + \cos\beta(r^2 + \delta x)\cos\delta\beta x$$
(15)

Therefore, a frequency spectrum thereof is represented by an overlap integral of respective frequency spectrums. Thus, even when a moire spectrum alone has a sharp peak, in practice, a ghost of the frequency spectrum of the Fresnel zone plate merely occurs at a position thereof. That is, there is no sharp peak in the spectrum. Therefore, even when light rays of a plurality of incidence angles are entered, a spectrum of a moire image detected is merely moire of a product of the front side grating and the back side grating at all times. When a single back side grating is present, only one peak of the detected spectrum is present for one incidence angle.

Here, a correspondence between parallel light described so far and light from an actual object will be schematically described with reference to FIG. 8. Light from each point included in the subject 201 is incident on a grating sensor integral substrate 901 of this imaging device strictly as a spherical wave from a point light source. In this instance, when the grating sensor integral substrate 901 is sufficiently small than the object or sufficiently far from the object, incidence angles of light rays illuminating the grating sensor integral substrate 901 from respective points can be regarded as the same incidence angles. From a relationship in which a moire spatial frequency displacement $\Delta u$ with respect to a minute angular displacement $\Delta\theta$ obtained from Formula (9) is less than or equal to 1/S which is a minimum resolution of a spatial frequency of the sensor, a condition that $\Delta\theta$ can be regarded as parallel light can be expressed as the following formula.

[Formula 16]

$$\Delta u = \frac{1}{\pi}\beta t\Delta\theta \le \frac{1}{S}$$
$$\Delta\theta \le \frac{\pi}{S\beta t}$$
(16)

From this formula, for example, in the condition of the present embodiment, $\Delta\theta<0.18°$ is satisfied, which is a condition that can be realized for a sensor size of 20 mm when a distance from the subject is 6 m.

From an analogy of the above result, it can be understood that image formation can be performed by this imaging device with respect to an infinitely distant object.

[Direction of Shifting Grating Pattern]

Next, a description will be given of a direction of shifting the grating pattern with reference to FIG. 9 and FIG. 10.

Figure 9:
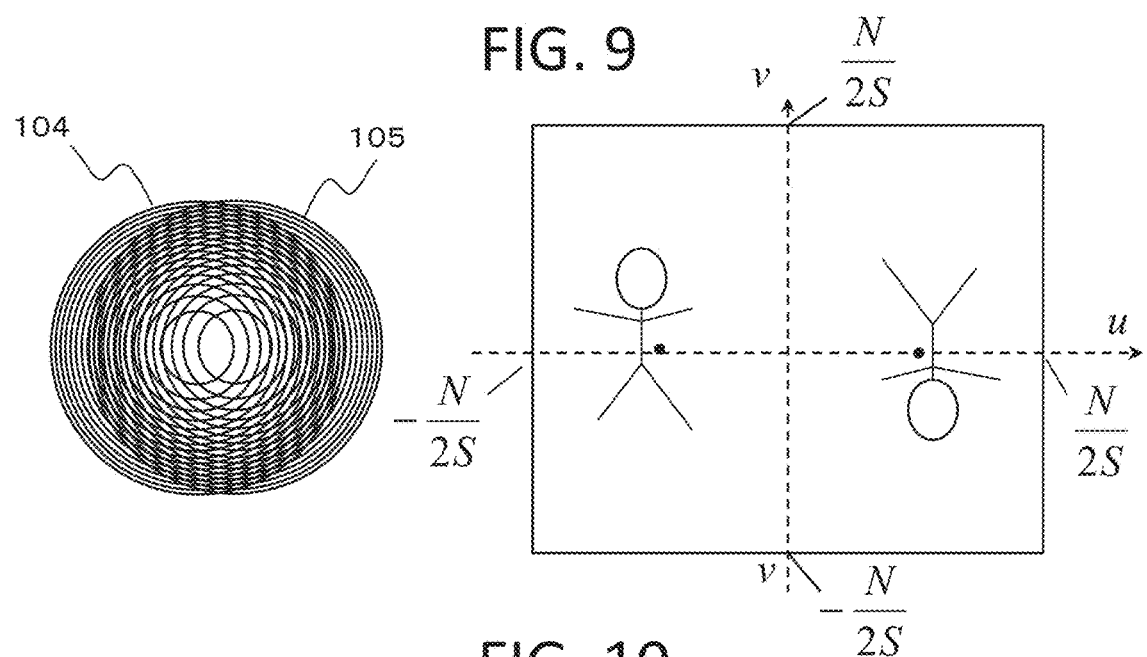
FIG. 9 is a diagram illustrating a spatial frequency spectrum when two grating patterns are shifted in a lateral direction.

FIG. 9 is a diagram illustrating a spatial frequency spectrum when two grating patterns are shifted in a lateral direction.

Figure 10:
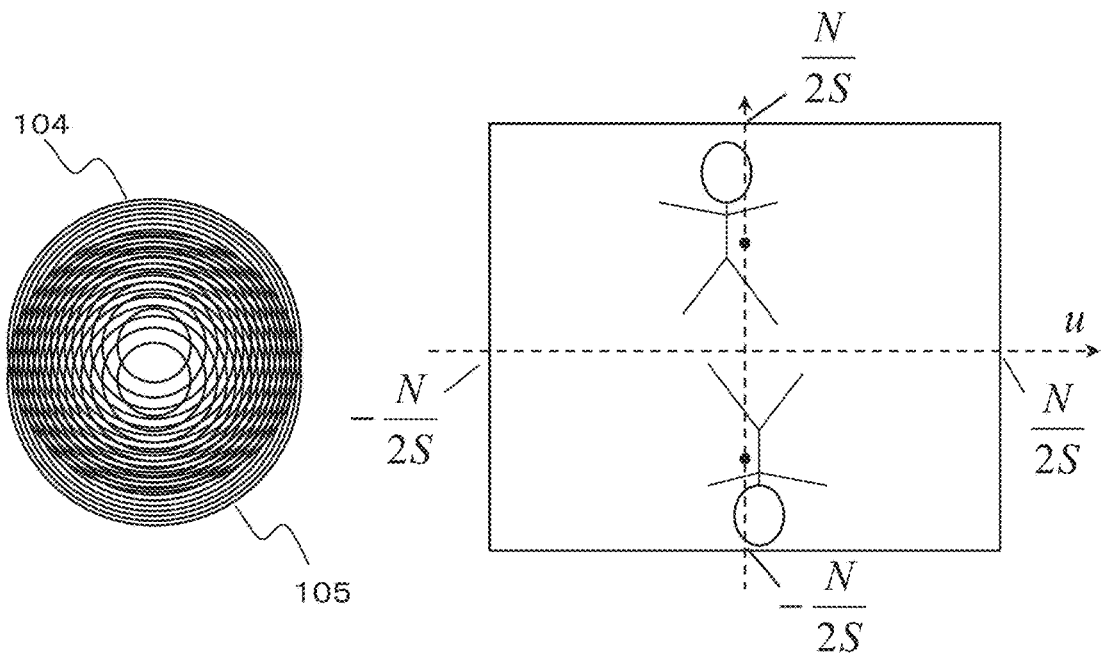
FIG. 10 is a diagram illustrating a spatial frequency spectrum when two grating patterns are shifted in a longitudinal direction.

FIG. 10 is a diagram illustrating a spatial frequency spectrum when two grating patterns are shifted in a longitudinal direction.

In the above-described example, as illustrated in FIG. 9, the front side grating pattern 104 and the back side grating pattern 105 were shifted to the left and right. In this instance, when it is presumed that a shape of the sensor is set to a square, and a pixel pitch thereof is the same in the x direction and the y direction, as illustrated on the right side of the figure, the spatial frequency spectrum of the sensor output is reproduced while the image is separated left and right within a frequency range of $\pm N/S$ in both x and y directions. However, in this way, an image of a picture is basically limited to a vertically long area. In general, since the image acquired by the camera is a horizontally elongated rectangle, it is desirable to adopt FIG. 10 as arrangement suitable therefor. In this instance, the front side grating pattern 104 and the back side grating pattern 105 are vertically shifted, and the image formed in a spatial frequency space of a sensor output is vertically separated. In this way, the output image can be made horizontally long.

[Imaging Device Using One-Sided Grating Substrate]

Next, a description will be given of an imaging device that realizes a function of the back surface side grating pattern in the imaging device using the double-sided grating substrate by changing a sensitivity distribution of the sensor with reference to FIG. 11 to FIG. 13.

Figure 11:
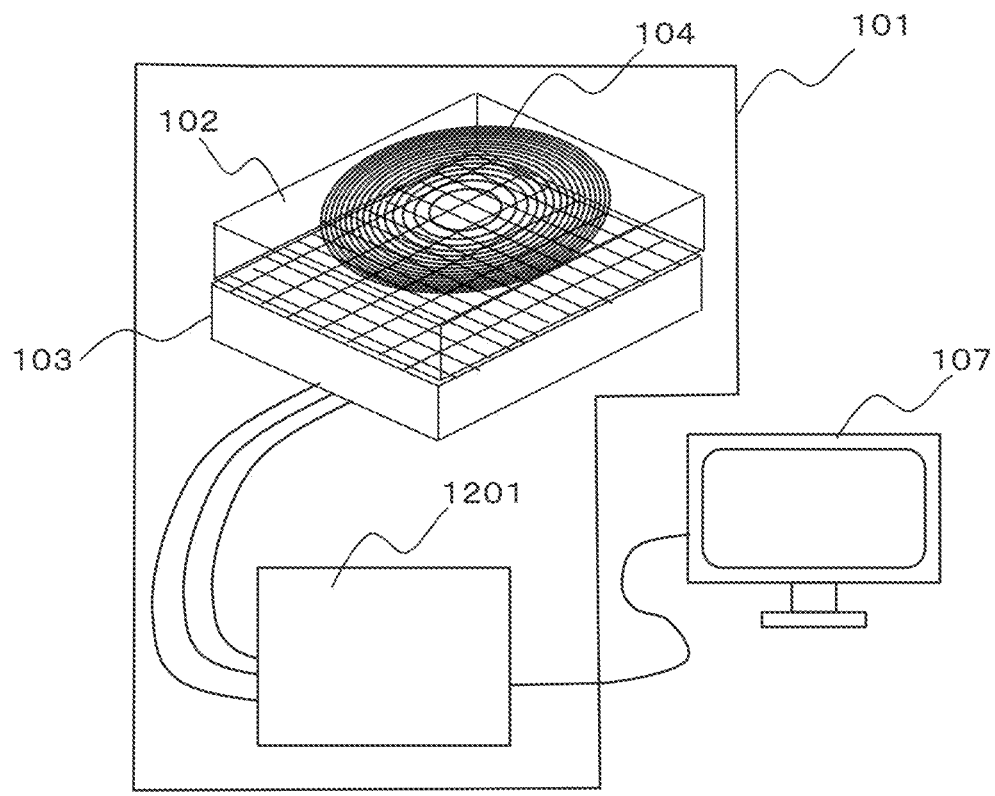
FIG. 11 is a configuration diagram of the imaging device when a back surface side grating pattern is realized by a sensor sensitivity distribution.

FIG. 11 is a configuration diagram of the imaging device when the back surface side grating pattern is realized by a sensor sensitivity distribution.

Figure 12:
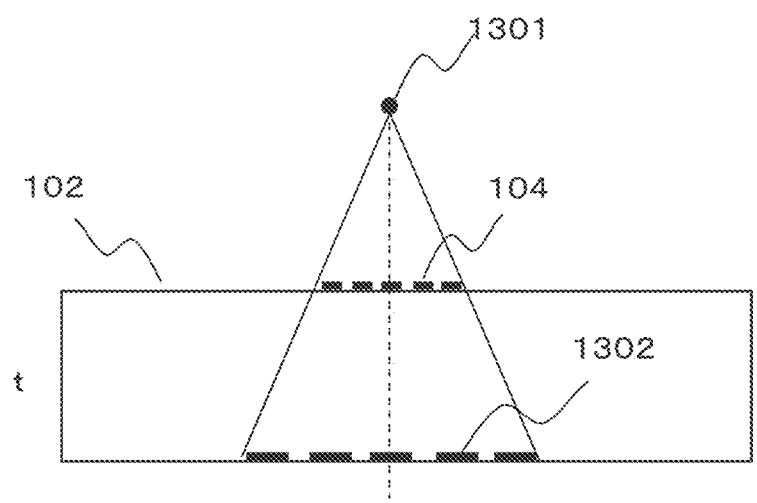
FIG. 12 is a diagram illustrating that when an object to be imaged is at a finite distance, a projection of a front side grating pattern onto the back surface is enlarged from the front side grating pattern.

FIG. 12 is a diagram illustrating that when an object to be imaged is at a finite distance, a projection of the front side grating pattern onto the back surface is enlarged from the front side grating pattern.

Figure 13:
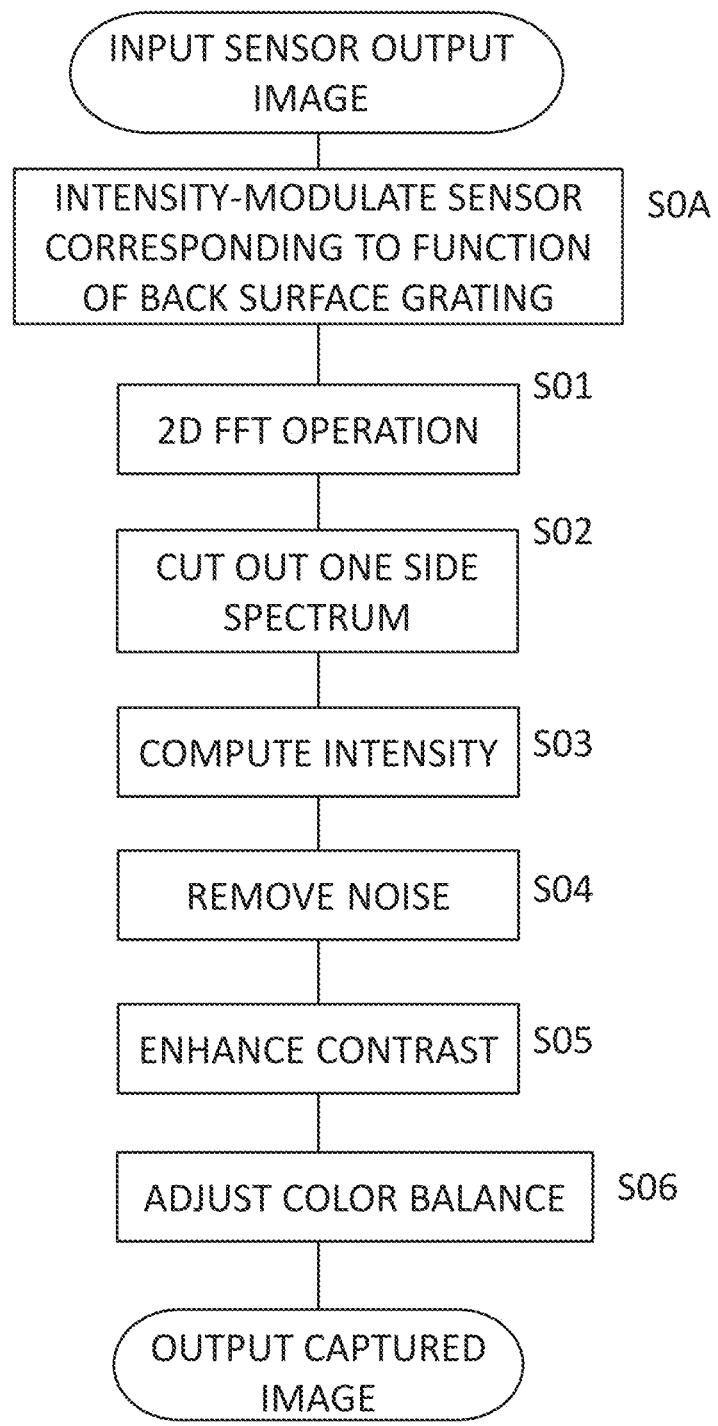
FIG. 13 is a flowchart illustrating processing of the image processing circuit of the imaging device when the back surface side grating pattern is realized by the sensor sensitivity distribution.

FIG. 13 is a flowchart illustrating processing of the image processing circuit of the imaging device when the back surface side grating pattern is realized by the sensor sensitivity distribution.

In the above example of the imaging device using the double-sided grating substrate, by disposing the same gratings on the front side and the back side of the grating substrate such that the gratings are shifted from each other, an angle of incident parallel light is detected from the spatial frequency spectrum of the moire fringe to form an image. However, since the grating on the back side is an optical element that modulates the intensity of light incident on the sensor in close contact therewith, by setting the sensitivity of the sensor effectively by taking the penetration ratio of the grating on the back side into consideration, moire can be virtually generated in the processed image. FIG. 11 illustrates a configuration of the imaging device when the back side grating is not present on the back surface of the grating substrate. In this way, the number of surfaces on which gratings are formed can be reduced by one, and thus the manufacturing cost of the element can be reduced. However, in this instance, it is necessary that the pixel pitch of the sensor is fine enough to sufficiently reproduce the grating pitch, or rough so that the grating pitch can be reproduced with the pixel pitch of the sensor. In the case of forming the grating on both surfaces of the substrate, the pitch of the grating may not be resolved by the pixel of the sensor, and it is sufficient that only the moire image can be resolved. Thus, it is possible to determine the grating pitch independently of the sensor pitch. However, when the function of the grating is realized by the sensor, the resolutions of the grating and the sensor need to be equal to each other. As a processing of an image processing circuit 1201, as illustrated in FIG. 13, an intensity modulation processing S0A of the sensor corresponding to the function of the back surface grating for generating the moire on the sensor output image is required, and an intensity modulation circuit therefor is required.

When the grating can be made variable in this way, detection light may not be parallel light. As illustrated in FIG. 12, when a spherical wave from a point 1301 included in an object irradiates the front side grating pattern 104 and a shadow 1302 thereof is projected on a lower surface, an image projected on the lower surface is almost uniformly enlarged. For this reason, by multiplying the penetration ratio distribution of the lower surface grating designed for parallel light without change, linear moire fringes at equal intervals are not generated. However, when the grating of the lower surface is enlarged in accordance with the shadow of the uniformly enlarged upper surface grating, linear moire fringes at equal intervals can be generated again for the enlarged shadow 1302. In this way, it is possible to selectively reproduce light from the point 1301 which may not be at infinity. Therefore, focusing becomes possible.

[Imaging Device Having Variable Front Surface Grating]

Next, a description will be given of an imaging device in which the front surface side grating pattern is made variable by a liquid crystal element, etc. with reference to FIG. 14 and FIG. 15.

Figure 14:
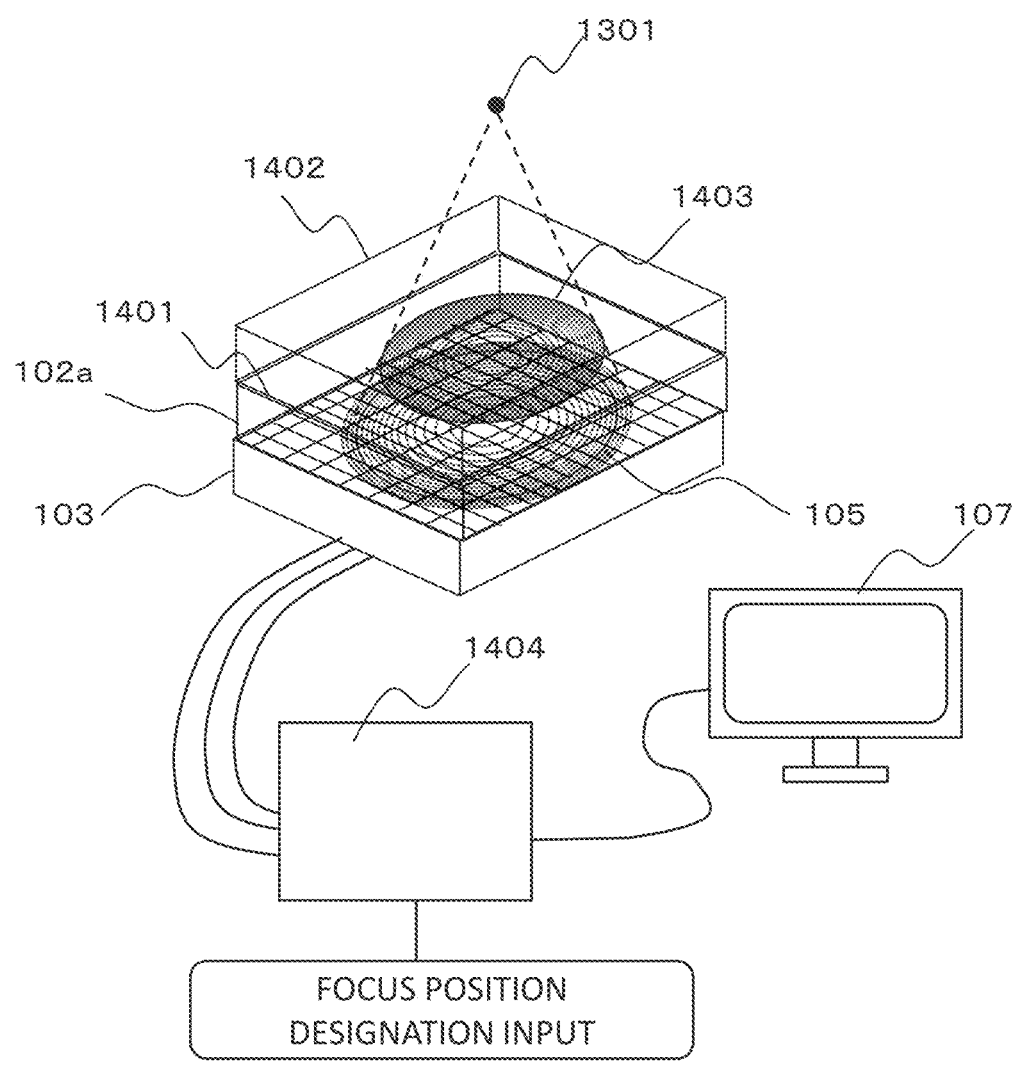
FIG. 14 is a configuration diagram of an imaging device for displaying a front surface grating pattern with a variable size by a liquid crystal element.

FIG. 14 is a configuration diagram of the imaging device for displaying the front surface grating pattern with a variable size by the liquid crystal element.

Figure 15:
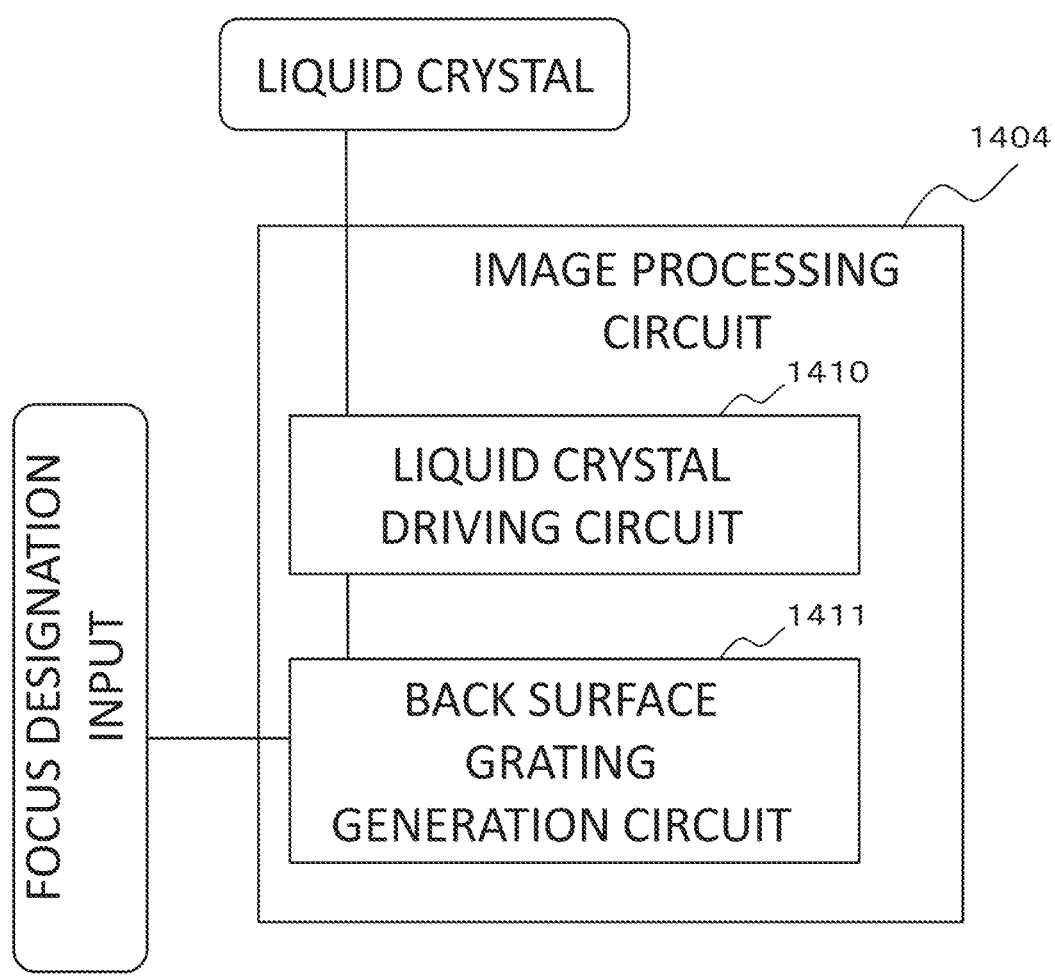
FIG. 15 is a block diagram of a portion related to liquid crystal control of an image processing circuit of the imaging device for displaying the front surface grating pattern with the variable size by the liquid crystal element.

FIG. 15 is a block diagram of a portion related to liquid crystal control of an image processing circuit of the imaging device for displaying the front surface grating pattern with the variable size by the liquid crystal element.

In the imaging device, the function of the back side grating pattern is realized by making the sensitivity distribution of the sensor variable. However, a grating of a front side substrate can be made variable using the liquid crystal element, etc. FIG. 14 is a configuration diagram of an imaging device that displays a variable grating 1403 on the front side substrate using the liquid crystal element sealed by a liquid crystal substrate 1402 with a liquid crystal layer 1401 interposed therebetween. Transparent electrodes are formed on the liquid crystal substrate 1402 and a grating substrate 102a, and an arbitrary grating image can be displayed via the electrodes (not illustrated). Light from the finite distance point 1301 which may not be regarded as basically infinite is divergent light. Thus, to have the same size as that of the back side grating pattern 105 on the back surface, slightly reduced one may be displayed on the surface. As illustrated in FIG. 15, a liquid crystal driving circuit 1410 and a back surface grating generation circuit 1411 are incorporated in an image processing circuit 1404. The back surface grating generation circuit 1411 generates a back surface grating pattern according to an external focus designation input, and the liquid crystal driving circuit 1410 is driven accordingly, thereby displaying a back surface grating pattern corresponding to an arbitrary focus position on the liquid crystal element integrated with the sensor.

[Imaging Device in which Double-Sided Grating Substrate is Divided]

A description will be given of an imaging device in which the double-sided grating substrate is divided with reference to FIG. 16 to FIG. 20.

Figure 16:
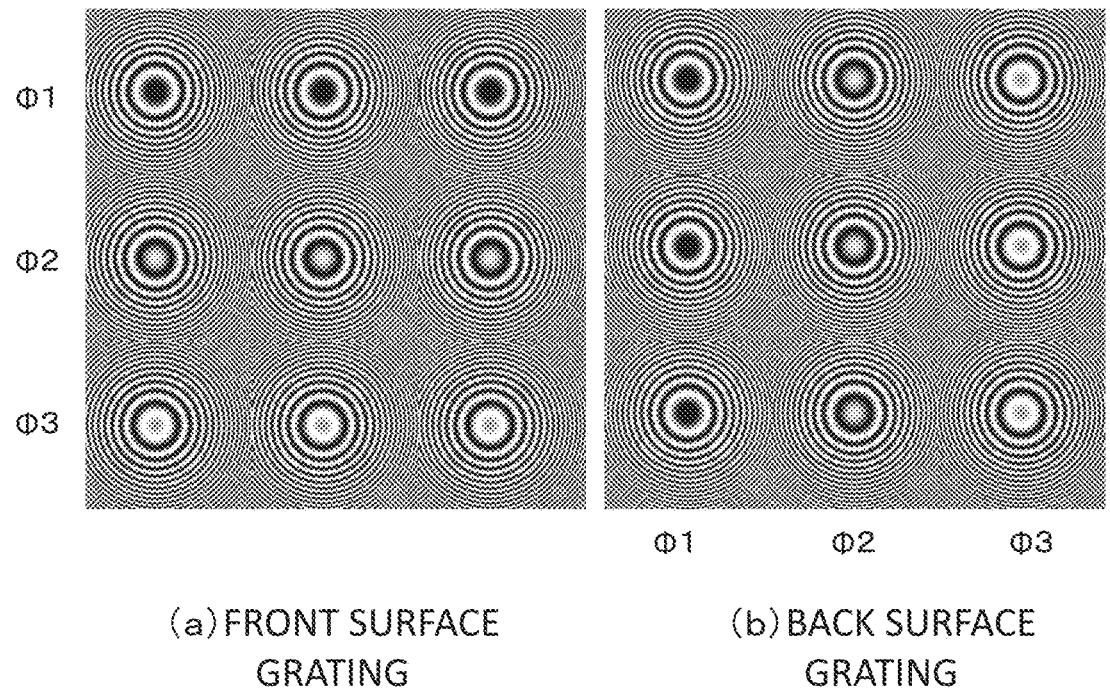
FIG. 16 is a diagram illustrating a grating pattern of 3×3 division.

FIG. 16 is a diagram illustrating a grating pattern of 3×3 division.

Figure 17:
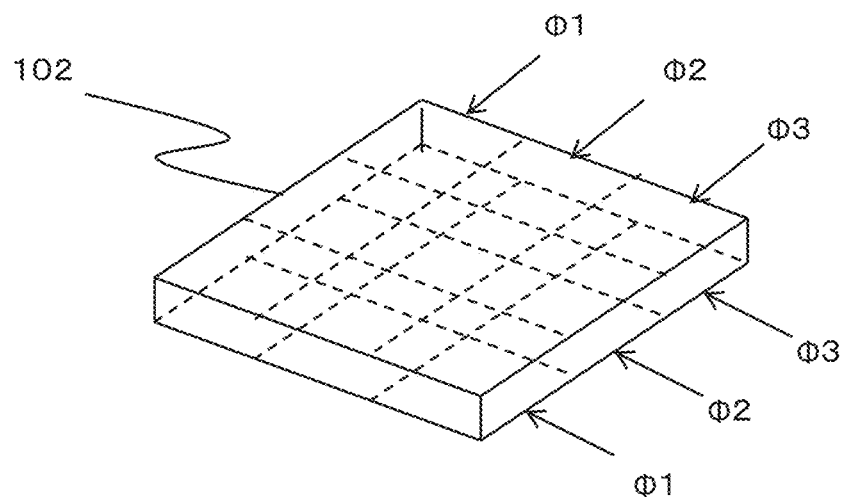
FIG. 17 is a perspective view illustrating arrangement of initial phases on both surfaces of the grating pattern of 3×3 division.

FIG. 17 is a perspective view illustrating arrangement of initial phases on both surfaces of the grating pattern of 3×3 division.

Figure 18:
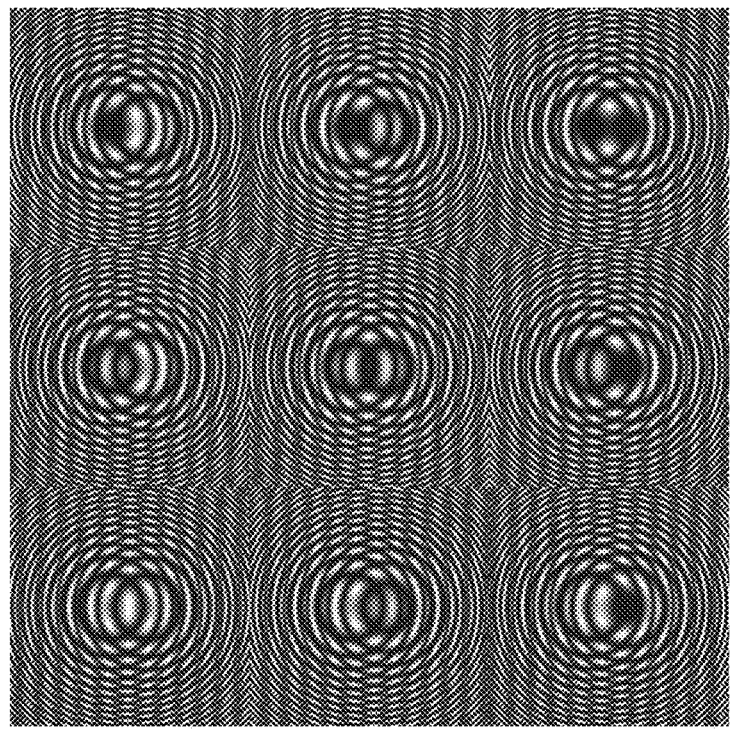
FIG. 18 is a diagram illustrating an image of a moire fringe generated when light from a single point light source enters a double-sided grating of 3×3 division.

FIG. 18 is a diagram illustrating an image of a moire fringe generated when light from a single point light source enters a double-sided grating of 3×3 division.

Figure 19:
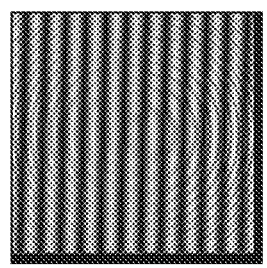
FIG. 19 is a diagram illustrating an image of a moire fringe obtained by performing noise reduction image processing.

FIG. 19 is a diagram illustrating an image of a moire fringe obtained by performing noise reduction image processing.

Figure 20:
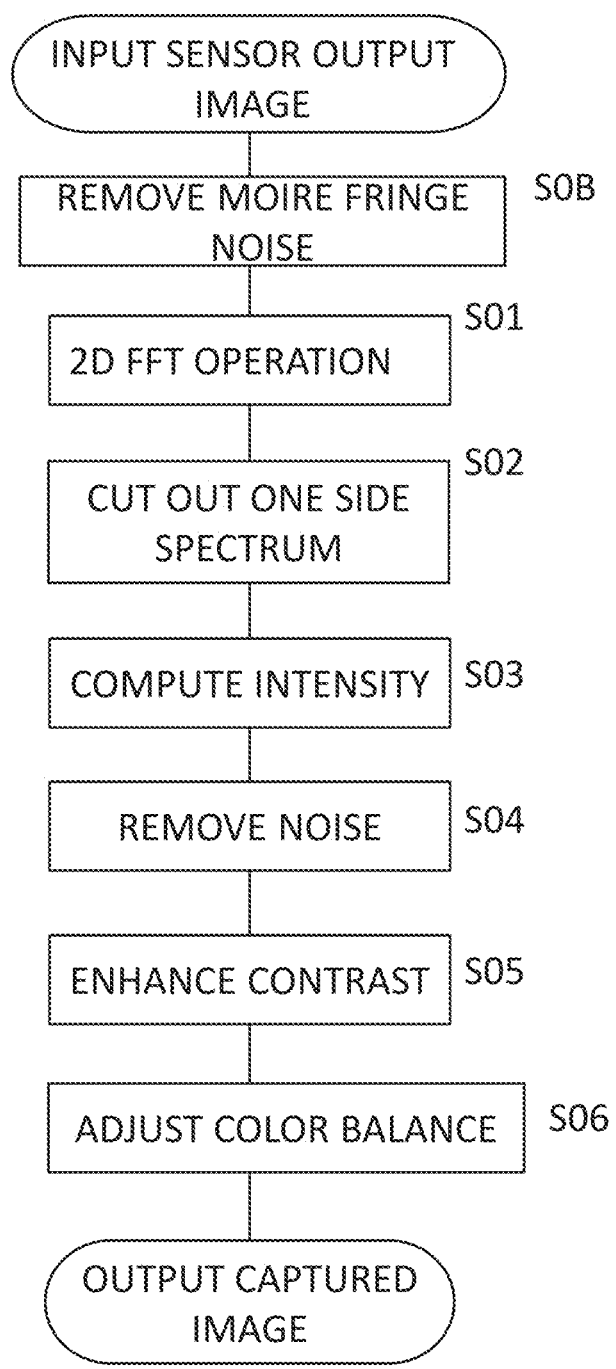
FIG. 20 is a flowchart illustrating processing of an image processing circuit of the imaging device in which the double-sided grating substrate is divided.

FIG. 20 is a flowchart illustrating processing of an image processing circuit of the imaging device in which the double-sided grating substrate is divided.

In the description of the principle of the imaging device using the double-sided grating substrate, it has been described that the sharp peak of the signal is obtained only in the frequency of the moire fringe of the fourth term in Formula (5). However, depending on the conditions of the optical system and the subject, the second and third terms may become noises to affect an image quality of a reproduced image. Therefore, a configuration for removing these noises will be described.

To remove noise, here, as illustrated in FIG. 16, independent zone plates are formed in areas obtained by dividing the front side grating and the back side grating into 3×3 or more, respectively. However, the respective zone plates are arranged without overlapping. In this instance, initial phases of the gratings are aligned to $\phi 1$, $\phi 2$, and $\phi 3$ at an upper side, a middle side, and a lower side in the front side grating and at a left side, a left-right middle side, and a right side in the back side grating, respectively. These initial phases are disposed as illustrated in FIG. 17. In this instance, the light intensity $I_s$ on a sensor surface can be expressed as the following formula.

[Formula 17]

$$I_S(x, y, \phi_F, \phi_B) = \left\{\sum_k I_k(x, y, \phi_F)\right\} I(x + \delta_0, y, \phi_B) = \qquad (17)$$

$$\frac{1}{4}\left[\sum_k A_k\{1 + \cos\{\beta((x+\delta_k)^2 + y^2) + \phi_F\}\}\right]$$

$$\{1 + \cos\{\beta((x+\delta_0)^2 + y^2) + \phi_B\}\} =$$

$$\frac{1}{8}\sum_k A_k\{2 + 2\cos\{\beta(r^2 + 2x\delta_k) + \phi_F\} +$$

$$2\cos\{\beta(r^2 + 2x\delta_0) + \phi_B\} + \cos\{2\beta(r^2 + (\delta_k + \delta_0)x) +$$

$$\phi_F + \phi_B\} + \cos\{2\beta(\delta_k - \delta_0)x + \phi_F - \phi_B\}\}$$

Here, $I_k$ denotes a light intensity distribution of the shadow of the front side grating by a kth point light source, and I denotes a penetration ratio distribution of the back side grating. Each of an initial phase $\phi_F$ of the front side grating and an initial phase $\phi_B$ of the back side grating takes three values of $\phi 1$, $\phi 2$, and $\phi 3$ as described above. It is presumed that the kth point light source illuminating the front side grating emits light with the intensity of $A_k$ and forms the shadow of the front side grating on the sensor with a shift of $\delta_k$. In { } in a lower part of Formula (17), a second term corresponds to the shadow of the front surface side grating, a third term corresponds to intensity modulation of the back surface side grating, a fourth term corresponds to a sum frequency component of two gratings, and a fifth term corresponds to a difference frequency component and corresponds to a term of a moire fringe which is a signal component used by this device. Therefore, it suffices to extract only a component having an added phase of $\phi_{F-a}$. When Formula (17) is expressed as below by focusing on $\phi F$ and $\phi B$,

[Formula 18]

$$I_S(\phi_F, \phi_B) = \frac{1}{8}\sum_k A_k \left\{\begin{array}{l} 2 + 2\cos(\theta_{1k} + \phi_F) + 2\cos(\theta_2 + \phi_B) + \\ \cos(\theta_{3k} + \phi_F + \phi_B) + \cos(\theta_{4k} + \phi_F - \phi_B) \end{array}\right\} \qquad (18)$$

coefficients of cos and sin can be extracted as below using orthogonality of trigonometric functions.

[Formula 19]

$$\frac{1}{8}\sum_k A_k\{2\cos\theta_2 + \cos(\theta_{3k} + \phi_F) + \cos(\theta_{4k} + \phi_F)\} = \qquad (19)$$

$$\frac{1}{\pi}\int_0^{2\pi} I_S(\phi_F, \phi_B)\cos\phi_B d\phi_B$$

[Formula 20]

$$\frac{1}{8}\sum_k A_k\{-2\sin\theta_2 - \sin(\theta_{3k} + \phi_F) + \sin(\theta_{4k} + \phi_F)\} = \qquad (20)$$

$$\frac{1}{\pi}\int_0^{2\pi} I_S(\phi_F, \phi_B)\cos\phi_B d\phi_B$$

Further, when terms of cos cos and sin sin are extracted from this formula, the following expressions can be obtained.

[Formula 21]

$$\frac{1}{8}\sum_k A_k(\cos\theta_{3k} + \cos\theta_{4k}) = \qquad (21)$$

$$\frac{1}{\pi^2}\int_0^{2\pi}\int_0^{2\pi} I_S(\phi_F, \phi_B)\cos\phi_B \cos\phi_F d\phi_B d\phi_F$$

[Formula 22]

$$\frac{1}{8}\sum_k A_k(-\cos\theta_{3k} + \cos\theta_{4k}) = \qquad (22)$$

$$\frac{1}{\pi^2}\int_0^{2\pi}\int_0^{2\pi} I_S(\phi_F, \phi_B)\sin\phi_B \sin\phi_F d\phi_B d\phi_F$$

When these formulae are added side by side, the following formula is obtained.

[Formula 23]

$$\frac{1}{8}\sum_k A_k \cos\theta_{4k} = \frac{1}{2\pi^2}\int_0^{2\pi}\int_0^{2\pi} I_S(\phi_F, \phi_B) \qquad (23)$$

$$(\cos\phi_B\cos\phi_F + \sin\phi_B\sin\phi_F)d\phi_B d\phi_F$$

However, this formula eventually corresponds to extraction of only a moire component in Formula (17) as below.

[Formula 24]

$$\frac{1}{8}\sum_k A_k\cos\{2\beta(\delta_k - \delta_0)x\} = \qquad (24)$$

$$\frac{1}{2\pi^2}\int_0^{2\pi}\int_0^{2\pi} I_S(\phi_F, \phi_B)\cos(\phi_B - \phi_F)d\phi_B d\phi_F$$

This calculation corresponds to scanning and integrating both the phase of the front side grating and the phase of the back side grating in two dimensions. The 3×3 double-sided Fresnel zone plate described in FIG. 16 and FIG. 17 is used to discretize this integration at three points corresponding to the number of minimum sampling points. A moire fringe obtained by this 3×3 double-sided grating based on a single point light source is illustrated in FIG. 18. A plurality of Fresnel zone plates appears to intersect, which corresponds to a light intensity distribution formed in a sensor shape by light incident on the Fresnel zone plates on both sides without intersection. Furthermore, a moire fringe obtained by combining moire fringes from respective 3×3 cells using Formula (24) is illustrated in FIG. 19. According to this figure, unnecessary noise other than moire fringes is greatly reduced. As a result, the quality of the captured image can be improved.

Processing of the image processing circuit according to the above principle illustrated in FIG. 20. In this flowchart, in addition to FIG. 3, a processing of removing moire fringe noise S0B is added.

[Image Device in which One-Sided Grating Substrate is Divided]

In the above description, the imaging device in which the double-sided grating substrate is divided has been described. Here, an example of division of a one-sided grating substrate will be described with reference to FIG. 21 to FIG. 23.

Figure 21:
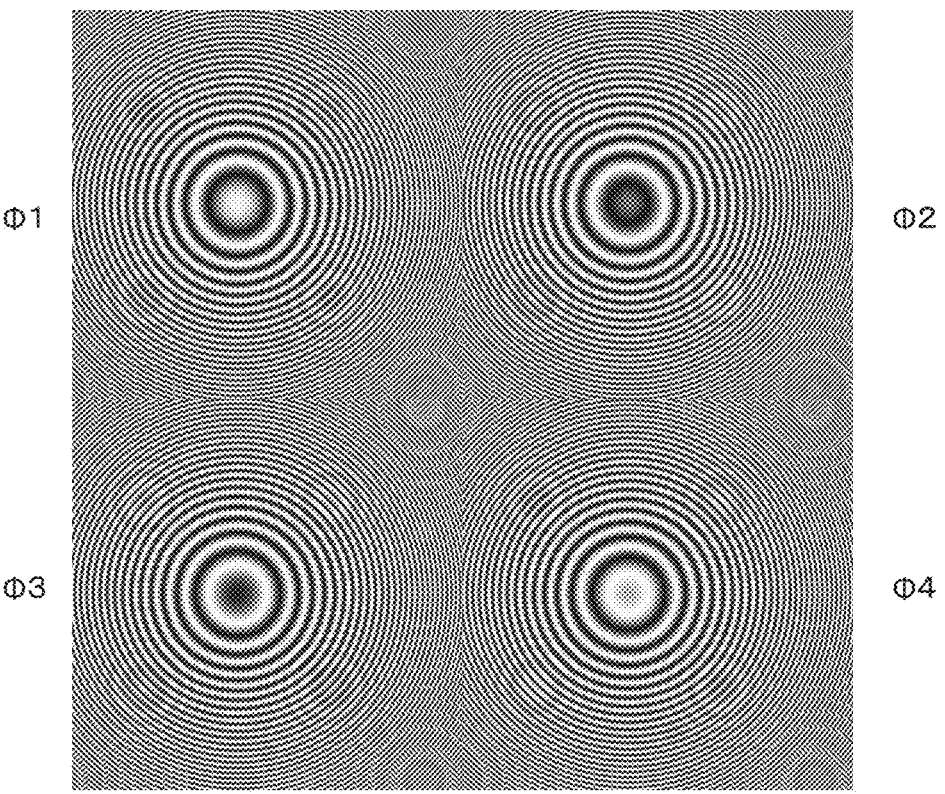
FIG. 21 is a diagram illustrating a grating pattern of 2×2 division.

FIG. 21 is a diagram illustrating a grating pattern of 2×2 division.

Figure 22:
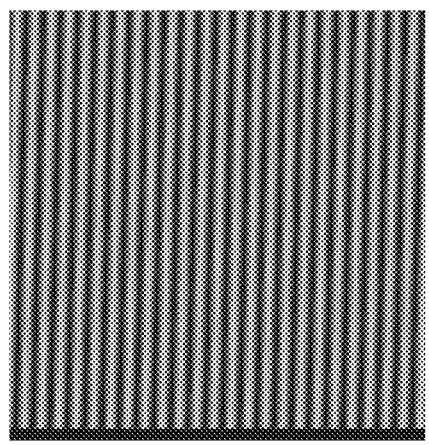
FIG. 22 is a diagram illustrating an image of a moire fringe obtained by performing noise reduction image processing.

FIG. 22 is a diagram illustrating an image of a moire fringe obtained by performing noise reduction image processing.

Figure 23:
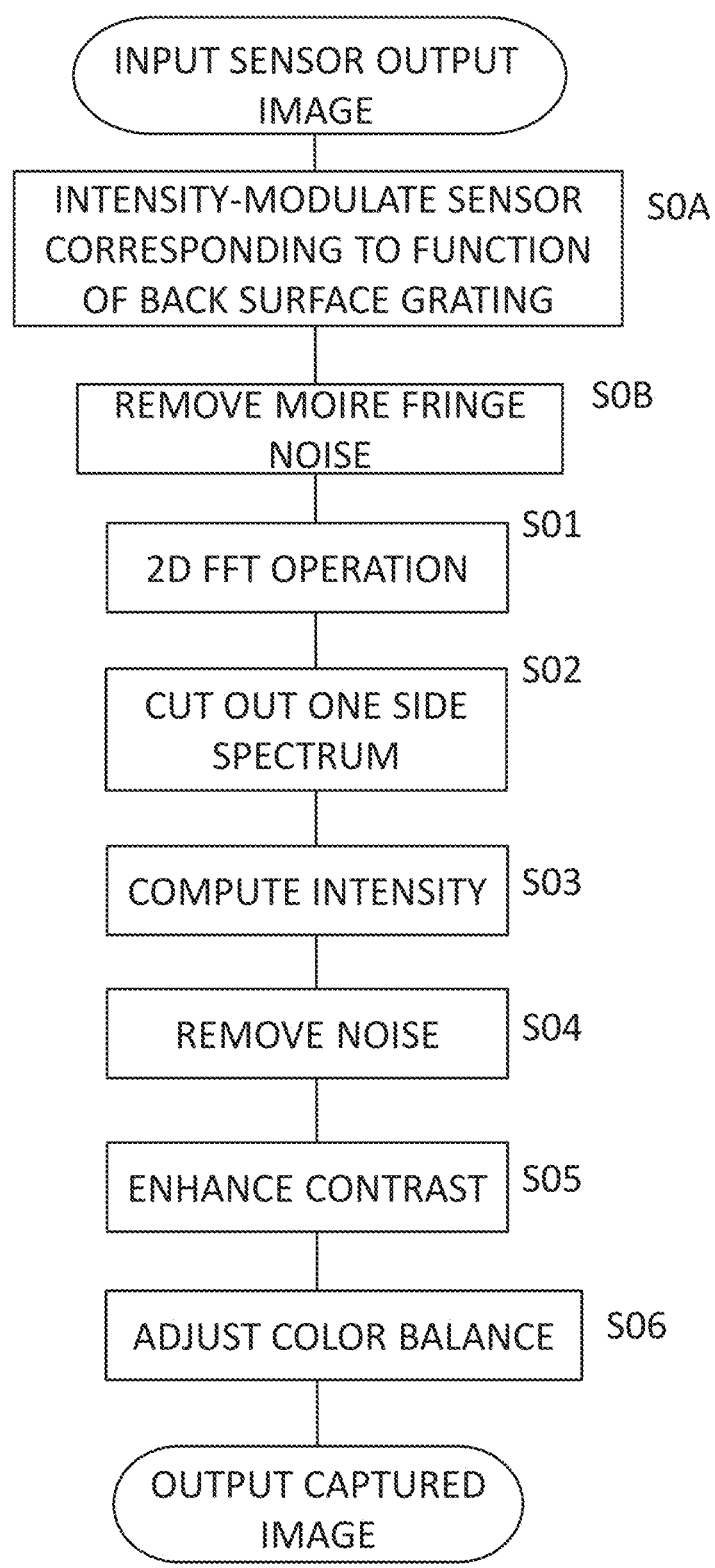
FIG. 23 is a flowchart illustrating processing of an image processing circuit of an imaging device in which a one-sided grating substrate is divided.

FIG. 23 is a flowchart illustrating processing of an image processing circuit of the imaging device in which the one-sided grating substrate is divided.

FIG. 21 illustrates a grating pattern in the case of forming a pattern of a different front side grating from that of the double-sided grating substrate illustrated above, which presumes a case in which the back surface side grating is not set to a fixed grating and sensor sensitivity is virtually given to the Fresnel zone plate shape or the case of using a liquid crystal element, etc. The grating is divided into 2×2 areas, and an initial phase of each Fresnel zone plate is shifted by 90°. In the imaging device in which the double-sided grating substrate is divided, the phases are shifted in columns or rows. However, in this device, phases are changed in all regions. In this way, when phases of virtual zone plates on the back surface side are changed by 90° in all regions in four steps to generate a moire fringe, it is possible to perform integration calculation in four phases on both surface gratings. As the division becomes finer, further improvement of noise reduction effect can be expected. The reproduced image of the moire fringe by the single point light source is illustrated in FIG. 22. Noise is further reduced when compared to the case of FIG. 19.

Processing of the image processing circuit according to the above principle illustrated in FIG. 23. In this flowchart, in addition to FIG. 20, a processing of the intensity modulation processing S0A of the sensor corresponding to the function of the back surface grating is added.

[Image Device Using Double-Sided Grating Substrate for Improving Resolution]

Next, a description will be given of the imaging device using the double-sided grating substrate for improving resolution with reference to FIG. 24.

Figure 24:
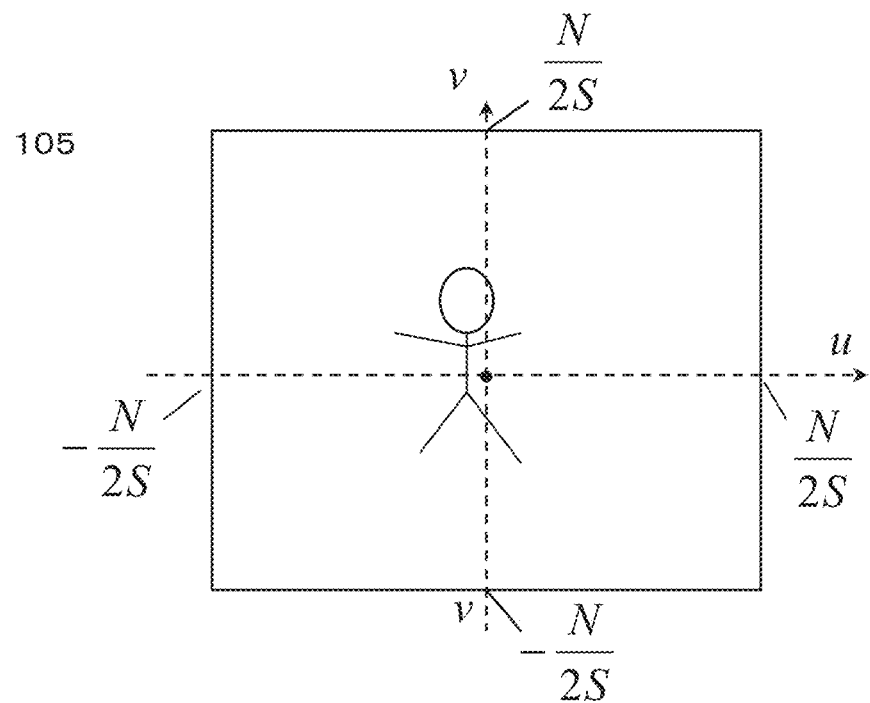
FIG. 24 is a diagram illustrating a spatial frequency spectrum in a case in which two grating pattern positions coincide with each other.

FIG. 24 is a diagram illustrating a spatial frequency spectrum in a case in which two grating pattern positions coincide with each other.

In the imaging device using the double-sided grating substrate described above, two reproduced images in a mirror image relationship occurring in the spatial frequency space are separated by laterally or vertically shifting the front side grating pattern 104 and the back side grating pattern 105 as illustrated in FIG. 9 and FIG. 10. However, for this reason, there is a problem that the number of pixels of the reproduced image is half that of a normal camera. Therefore, a description will be given of a configuration that avoids generation of a mirror image and does not decrease the number of effective pixels.

A spatial frequency spectrum of one moire fringe produces two peaks on the plus side and the minus side since the moire fringe is used as a real function of a sinusoidal wave. That is, two separated complex exponential functions which are $\cos(x)=(\exp(ix)+\exp(-ix))/2$ correspond to the respective peaks of the spectrum. Here, i is an imaginary unit. Therefore, the moire fringe can be represented by one complex exponential function from the beginning. In the imaging device in which the double-sided grating substrate is divided, the method of canceling noise and extracting only the signal component of the moire fringe has been described. The terms of cos cos and sin sin have been extracted in Formulae (21) and (22) referred to in the above. In a similar manner, when components of cos sin and sin cos are extracted, the following expressions can be obtained.

[Formula 25]

$$\frac{1}{8}\sum_k A_k (-\sin\theta_{3k} - \sin\theta_{4k}) = \qquad (25)$$

$$\frac{1}{\pi^2}\int_0^{2\pi}\int_0^{2\pi} I_S(\phi_F, \phi_B)\cos\phi_B \sin\phi_F d\phi_B d\phi_F$$

[Formula 26]

$$\frac{1}{8}\sum_k A_k (-\sin\theta_{3k} + \sin\theta_{4k}) = \qquad (26)$$

$$\frac{1}{\pi^2}\int_0^{2\pi}\int_0^{2\pi} I_S(\phi_F, \phi_B)\sin\phi_B \cos\phi_F d\phi_B d\phi_F$$

When a difference between these formulae is obtained side by side, the following formula is obtained.

[Formula 27]

$$\frac{1}{8}\sum_k A_k \sin\theta_{4k} = \frac{1}{2\pi^2}\int_0^{2\pi}\int_0^{2\pi} I_S(\phi_F, \phi_B) \qquad (27)$$

$$(\sin\phi_B \cos\phi_F - \cos\phi_B \sin\phi_F)d\phi_B d\phi_F$$

Similarly to the cos wave component of the moire fringe of Formula (24), it is possible to extract a sin wave component of the moire fringe as below.

[Formula 28]

$$\frac{1}{8}\sum_k A_k \sin\{2\beta(\delta_k - \delta_0)x\} = \qquad (28)$$

$$\frac{1}{2\pi^2}\int_0^{2\pi}\int_0^{2\pi} I_S(\phi_F, \phi_B)\sin(\phi_B - \phi_F)d\phi_B d\phi_F$$

When Formula (24) and Formula (28) are added side by side as the real part and the imaginary part of the complex exponential function, it is possible to obtain the following formula.

[Formula 29]

$$\frac{1}{8}\sum_k A_k \exp\{i2\beta(\delta_k - \delta_0)x\} = \qquad (29)$$

$$\frac{1}{2\pi^2}\int_0^{2\pi}\int_0^{2\pi} I_S(\phi_F, \phi_B)\exp\{i(\phi_B - \phi_F)\}d\phi_B d\phi_F$$

That is, by multiplying the sensor image by the complex exponential function of the phase difference between the front side grating and the back side grating and performing double integration, it is possible to extract a signal waveform of the moire fringe as a complex exponential function. By Fourier-transforming this function, it is possible to obtain a spectral image of a spatial frequency component only on the plus side or the minus side.

This principle can be understood from the analogy with the diffraction grating in the optical component. In general, an angular distribution of light penetrating the optical element corresponds to a spatial frequency spectrum of an amplitude penetration ratio distribution of the element, and discrete diffracted light reflecting the grating shape is generated from a periodic structure such as a diffraction grating. In a case in which the penetration ratio of the grating is realized by shading, etc., the penetrating light is separated into 0th order light traveling straight and a plurality of diffracted lights generated symmetrically on both sides thereof. However, when only one order of light is required as in a diffractive lens, etc., a blazed diffraction grating is used to eliminate unnecessary order light and improve light utilization efficiency. This grating is a phase grating in which a cross section of the grating has a sawtooth shape, and it is possible to concentrate the diffracted light on one order. Formula (29) is equivalent to expressing a moire fringe as a blazed diffraction grating and focusing diffraction orders on one order, which can be realized since the phases of the front side grating and the back side grating are changed so that not only the intensity of the moire fringe but also the phase is detected.

In a case in which peaks of a spatial frequency of one moire fringe component can be integrated into one point as described above, when center positions of the concentric circular zone plates of the front side grating pattern 104 and the back side grating pattern 105 are disposed on a normal line with respect to a sensor surface standing from a local sensor center, it becomes possible to display a reproduced image at a center in a spatial frequency space as illustrated in FIG. 24, and to obtain a reproduced image having the same number of pixels as the number of pixels of the sensor. In this case, $\delta_0=0$ is satisfied, and a moire fringe component corresponding to a signal can be expressed as below.

[Formula 30]

$$\frac{1}{8}\sum_k A_k \exp\{2\beta\delta_k x\} = \frac{1}{2\pi^2}\int_0^{2\pi}\int_0^{2\pi} I_S(\phi_F, \phi_B)\exp(\phi_B - \phi_F)d\phi_B d\phi_F \quad (30)$$

Formula (30) can be expressed by terms of one Dirac delta function when viewed in (u, v) space.

[Phase Variation Means of Grating Substrate]

Next, a description will be given of an imaging device in which an initial phase of the grating substrate is variable with reference to FIG. 25 to FIG. 28.

Figure 25:
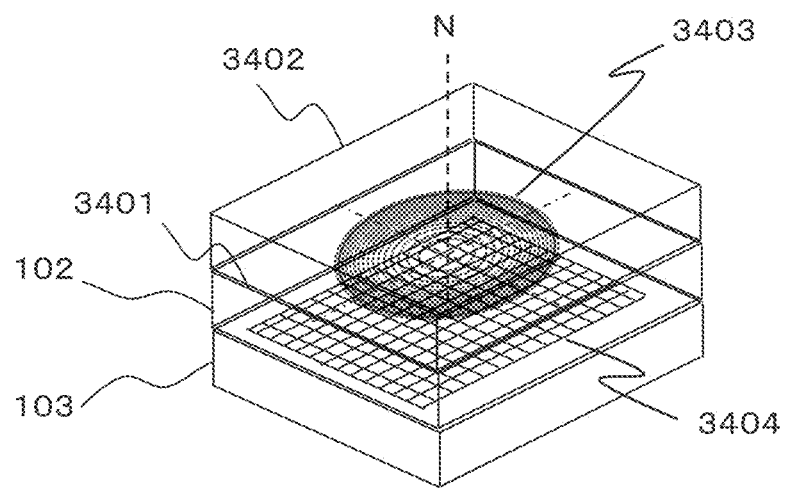
FIG. 25 is a diagram illustrating arrangement of an imaging device of a grating substrate and an image sensor in a case in which a phase of a front side grating is made variable.

FIG. 25 is a diagram illustrating arrangement of an imaging device of a grating substrate and an image sensor in a case in which a phase of a front side grating is made variable.

Figure 26:
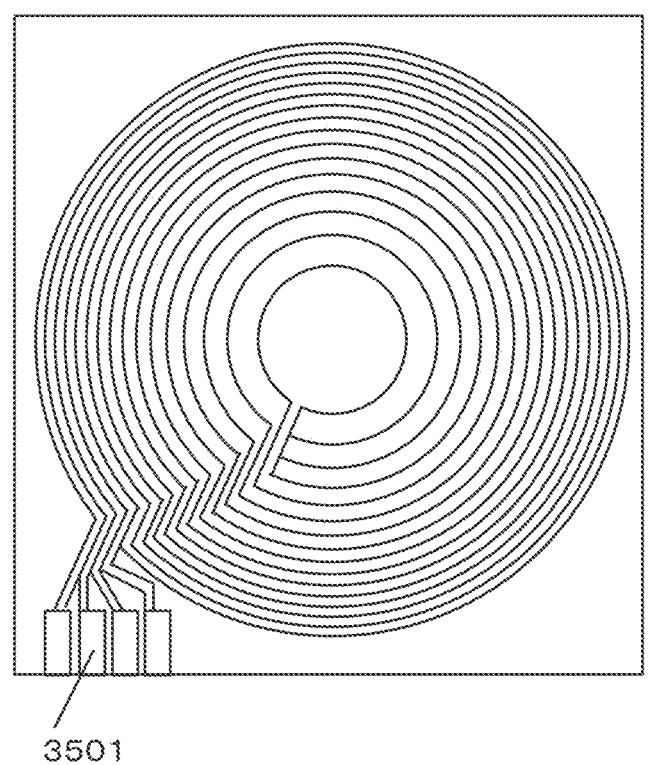
FIG. 26 is a diagram illustrating an example of an electrode pattern of the liquid crystal element.

FIG. 26 is a diagram illustrating an example of an electrode pattern of the liquid crystal element.

Figure 27:
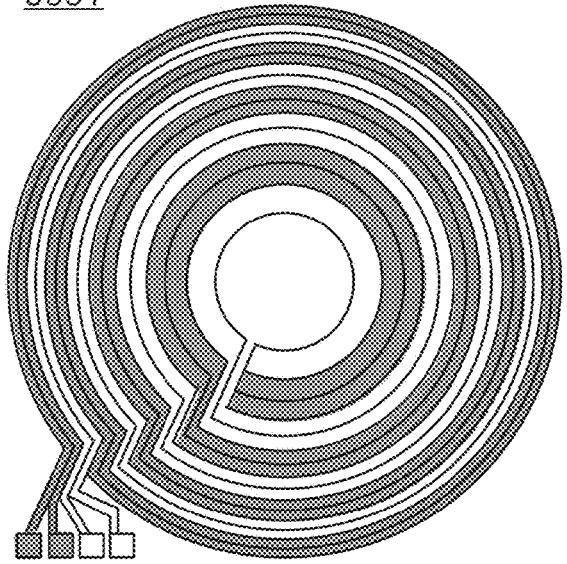
FIG. 27 is a schematic view in a case in which an initial phase of the electrode pattern of the liquid crystal element is variably input.
Figure 27:
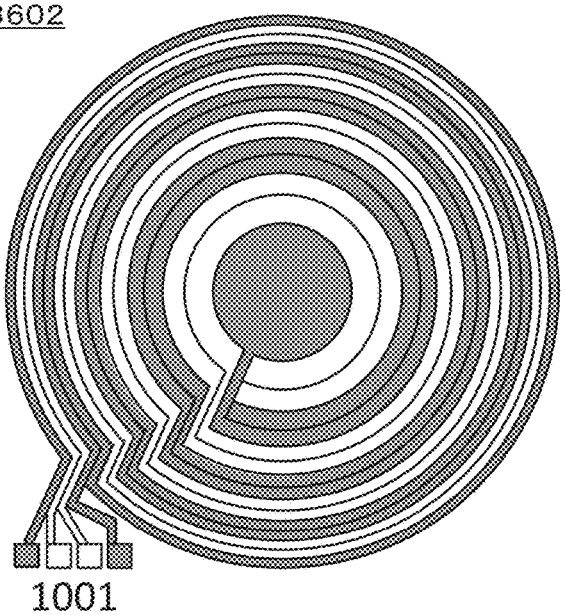
Figure 27:
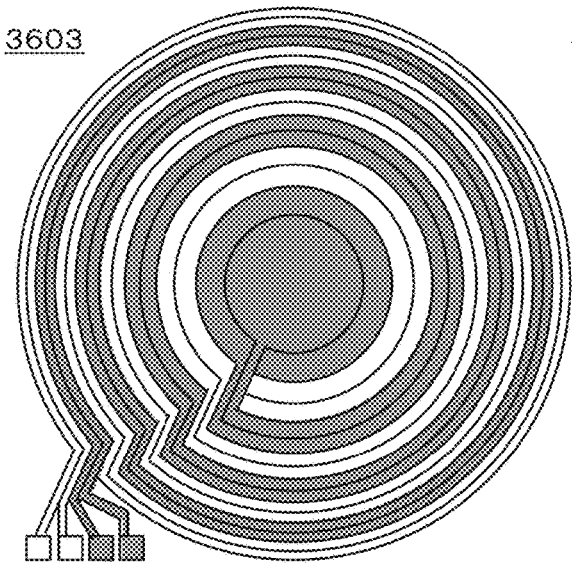
Figure 27:
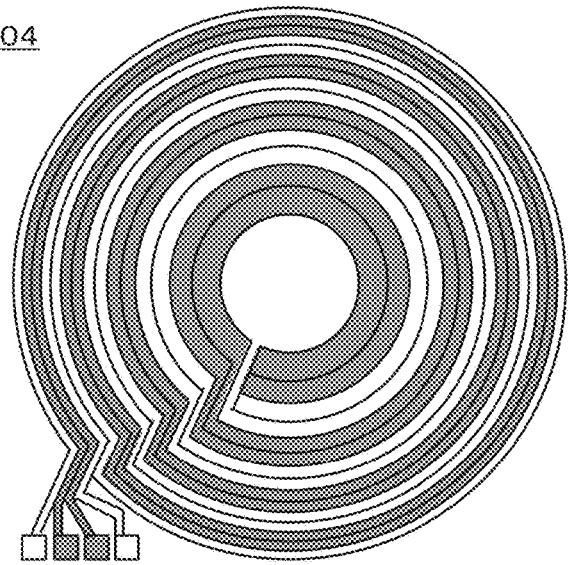

FIG. 27 is a schematic view in a case in which an initial phase of the electrode pattern of the liquid crystal element is variably input.

Figure 28:
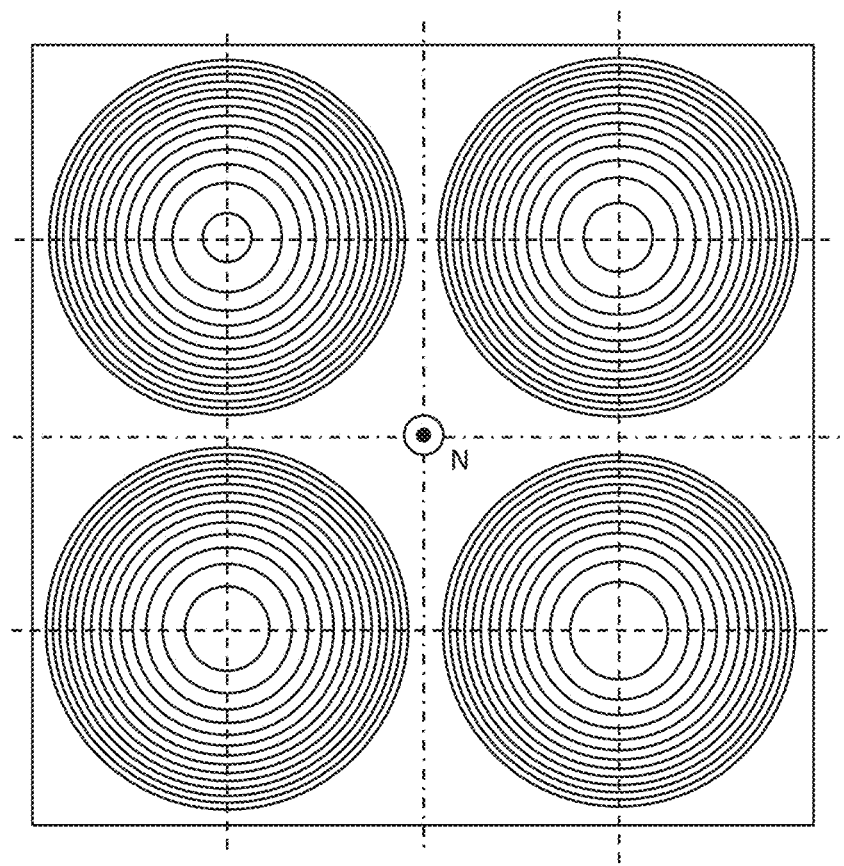
FIG. 28 is a diagram illustrating an arrangement example of a zone plate in the case of varying an initial phase of the front side grating.

FIG. 28 is a diagram illustrating an arrangement example of a zone plate in the case of varying an initial phase of the front side grating.

In a case in which the liquid crystal element is used as varying means for an initial phase of the front side grating, as illustrated in FIG. 25, a center of a concentric circular electrode of a zone plate 3403 formed as a liquid crystal electrode is disposed on a normal line N standing at a center position of a sensor light receiving portion 3404. However, strict accuracy may not be requested. When the normal line N is present in at least a center circular electrode, it is considered that no problem will occur in many cases. In the imaging device in which the front side grating is made variable described above, the liquid crystal element is used as a zone plate size varying means for focus adjustment.

However, in this device, the liquid crystal element is used as means for varying the initial phase of the zone plate. For example, the electrode pattern may be configured as in the schematic view illustrated in FIG. 26. Concentric circular electrodes are formed to divide one period of the grating pattern of the zone plate into four parts, and are connected to outer electrodes every four electrodes from the inside. Finally, four electrodes are output as driving terminals of the electrodes at a terminal portion 3501. To actually vary the initial phase by applying a predetermined voltage thereto, a scheme of FIG. 27 is used. An electrode state of applying a state 3601 of an initial phase 0, a state 3602 of π/2, a state 3603 of π, and a state 3604 of 3π/2 to four electrodes is realized by temporally switching between two states of "0" and "1". A hatched electrode indicates that light is shielded, and a white electrode indicates that light is transmitted. In addition, the initial phase of the back side grating is made variable by setting effective light receiving sensitivity of the sensor as a virtual penetration ratio. In this device, since the change in the initial phase of the back side grating is performed as image processing, temporal variation may not be needed depending on the computation capability of the device, parallel computation is allowed. Calculation based on Formula (30) is performed from a detected image of a virtual moire fringe by all combinations of varied initial phases of the front side grating and the back side grating to obtain a moire fringe image having luminance of a complex number from which noise is removed. By performing 2D Fourier transform thereon, a final detected image is obtained.

In addition, when the initial phase of the front side grating is varied by arranging the four zone plates illustrated in FIG. 21 side by side in the plane, center positions of the four zone plates whose initial phases are changed are disposed symmetrically with respect to the normal line N passing through the center of the sensor as illustrated in FIG. 28. In other words, a quadrangle formed by center positions of concentric circles of the four zone plates is a square, and the normal line N of the sensor center passes through a center of the square.

Using this method, phase information can be acquired by computation at the time of image reproduction, and resolution can be improved in addition to noise removal of the reproduced image.

[Reduction of Phase Change Processing]

Next, a description will be given of an example of reducing phase change processing when the one-sided grating substrate is divided with reference to FIG. 29.

Figure 29:
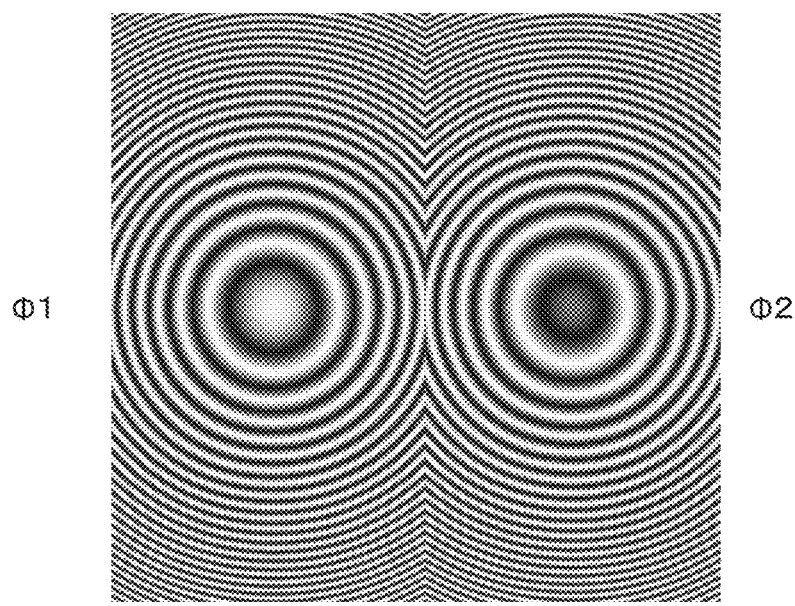
FIG. 29 is a diagram illustrating an example of the front surface grating pattern in the case of dividing the one-sided grating substrate.

FIG. 29 is a diagram illustrating an example of the front surface grating pattern in the case of dividing the one-sided grating substrate.

In the example of dividing the one-sided grating substrate illustrated in FIG. 21, the sensor sensitivity is virtually given to the Fresnel zone plate shape without using the back surface side grating as the fixed grating, and a description has been given of noise removal of the moire fringe performed by changing the phases of the virtual zone plates on the back surface side by 90° in all regions in four steps. However, here, a description will be given of a configuration which further reduces the number of steps and allows noise removal by phase change in two steps.

FIG. 29 illustrates an example of the front side grating in this device, and a phase difference between φ1 and φ2 is π/2. Here, when the back surface side grating is used as a virtual zone plate, it is possible to handle a negative component of cos in a formula expressing the zone plate, and the light intensity Is on the sensor surface can be expressed as below.

[Formula 31]

$$I_S(x, y, \phi_F, \phi_B) = \left\{\sum_k I_k(x, y, \phi_F)\right\} I(x + \delta_0, y, \phi_B) = \qquad (31)$$

$$\frac{1}{4}\left[\sum_k A_k\{1 + \cos\{\beta((x+\delta_k)^2 + y^2) + \phi_F\}\}\right]$$

$$\{\cos\{\beta((x+\delta_0)^2 + y^2) + \phi_B\}\} =$$

$$\frac{1}{8}\sum_k A_k \begin{Bmatrix} 2\cos\{\beta(r^2 + 2x\delta_0) + \phi_B\} + \\ \cos\{2\beta(r^2 + (\delta_k + \delta_0)x) + \phi_F + \phi_B\} + \\ \cos\{2\beta(\delta_k - \delta_0)x + \phi_F - \phi_B\} \end{Bmatrix}$$

A second term in { } of an expression on a lower side of Formula (31) indicates the intensity modulation of the back surface side grating, and a value thereof is known, and thus can be subtracted. After subtraction, the following formula is obtained.

[Formula 32]

$$I_S(x, y, \phi_F, \phi_B) - I(x + \delta_0, y, \phi_B) = \qquad (32)$$

$$\frac{1}{8}\sum_k A_k\{\cos\{2\beta(r^2 + (\delta_k + \delta_0)x) + \phi_F + \phi_B\} +$$

$$\cos\{2\beta(\delta_k - \delta_0)x + \phi_F - \phi_B\}\}$$

A second term in { } on a lower side of Formula (32) indicates a sum frequency component of two gratings. When this term can be removed, only a term of the moire fringe can be expressed. Here, paying attention to each of $\phi_F$ and $\phi_B$ in the second term and a third term, when a difference between $\phi_F + \phi_B$ and $\phi_{F-a}$ is 0, for example, in the case of $\phi_F = \phi_B = 0$, both the second term and the third term have positive values. On the other hand, when the difference between $\phi_F + \phi_B$ and $\phi_{F-a}$ is $\pi$, for example, in the case of $\phi_F = \phi_B = \pi/2$, the second term has a negative value, and the third term has a positive value. By averaging the light intensities $I_s$ obtained by changing combinations of $\phi_F$ and $\phi_B$ in two ways, it is possible to leave only a term of the moire fringe. An example of averaging results obtained by combining $\phi_F = \phi_B = 0$ and $\phi_F = \phi_B = \pi/2$ and computing the term of the moire fringe is shown below.

[Formula 33]

$$\frac{1}{2}(I_{M0,0} + I_{M\pi/2,\pi/2}) = \qquad (33)$$

$$\frac{1}{8}\sum_k A_k\{2 + \cos\{2\beta(r^2 + (\delta_k + \delta_0)x)\} + \cos\{2\beta(\delta_k - \delta_0)x\}\} +$$

$$\frac{1}{8}\sum_k A_k\{2 - \cos\{2\beta(r^2 + (\delta_k + \delta_0)x)\} + \cos\{2\beta(\delta_k - \delta_0)x\}\} =$$

$$\frac{1}{8}\sum_k A_k\{4 + 2\cos\{2\beta(\delta_k - \delta_0)x\}\}$$

However, here, $I_{M\phi F, \phi B}$ represents a result of subtracting the second term of Formula (31) from a result of multiplying the front surface side grating of the initial phase $\phi_F$ by the back surface side grating of the initial phase $\phi_B$.

Furthermore, here, from symmetry of a trigonometric function, each of the second term and the third term corresponds to a negative sin component in the case of $\phi_{F-a} = \pi/2$, for example, in the case of $\phi_F = \pi/2$ and $\phi_B = 0$, and the second term corresponds to a negative sin component and the third term corresponds to a positive sin component in the case of $\phi_{F-a} = -\pi/2$, for example, in the case of $\phi_F = 0$ and $\phi_B = \pi/2$. In the description of the principle of the imaging device using the double-sided grating substrate for improving the resolution, a description has been given of a method of creating a moire fringe by adding sin and cos to display a reproduced image at the center in the spatial frequency space, thereby improving the resolution. However, here, it is possible to improve the resolution of the reproduced image by adding sin components. An example of computing a term of the moire fringe using a cos component and a sin component from four combinations in the case of setting $\phi_F$ to 0 and $\pi/2$ and setting $\phi_B$ to 0 and $\pi/2$ is as below.

[Formula 34]

$$\frac{1}{2}(I_{M0,0} + I_{M\pi/2,\pi/2}) + i\frac{1}{2}(I_{M0,\pi/2} - I_{M\pi/2,0}) = \qquad (34)$$

$$\frac{1}{8}\sum_k A_k\{2 + \cos\{2\beta(r^2 + \delta_k x)\} + \cos\{2\beta\delta_k x\}\} +$$

$$\frac{1}{8}\sum_k A_k\{2 - \cos\{2\beta(r^2 + \delta_k x)\} + \cos\{2\beta\delta_k x\}\} +$$

$$\frac{1}{8}\sum_k A_k\{2 - \sin\{2\beta(r^2 + \delta_k x)\} + \sin\{2\beta\delta_k x\}\} -$$

$$\frac{1}{8}\sum_k A_k\{2 - \sin\{2\beta(r^2 + \delta_k x)\} - \sin\{2\beta\delta_k x\}\} =$$

$$\frac{1}{8}\sum_k A_k\{4 + 2\cos\{2\beta\delta_k x + \phi_F - \phi_B\} + i2\sin\{2\beta\delta_k x + \phi_F - \phi_B\}\}$$

From the above description, it is possible to remove noise of the moire fringe using the front side grating whose phase is shifted by $\pi/2$ for each region and the back side grating whose phase is shifted by $\pi/2$ for each region. Further, by changing the phase of the back side grating in all regions by 90° in two steps, the moire fringe can be represented by an exponential function, and the resolution can be improved.

[Imaging Device Capable of Temporally Switching Display of Both Front Side Grating and Back Side Grating]

Next, a description will be given of an imaging device capable of temporally switching display of both the front side grating and the back side grating with reference to FIG. 30 to FIG. 32.

Figure 30:
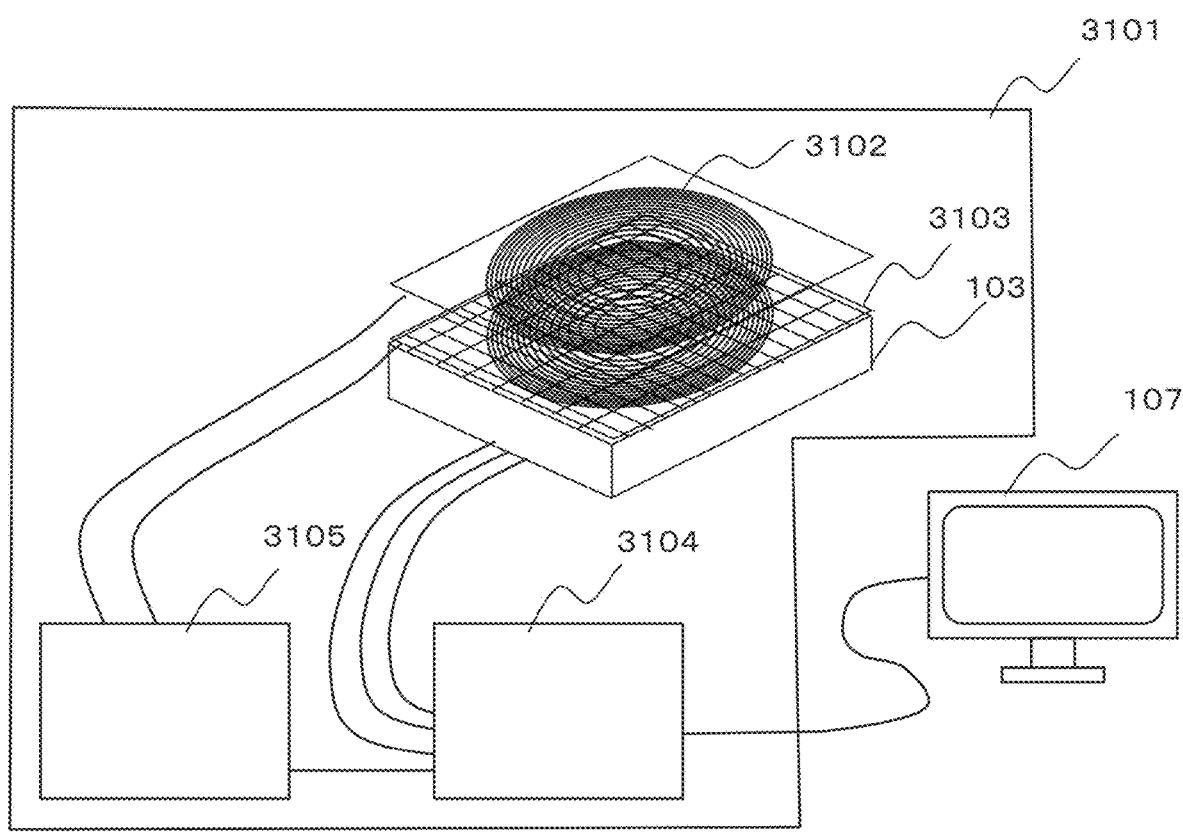
FIG. 30 is a configuration diagram of an imaging device capable of temporally switching display of both a front side grating and a back side grating.

FIG. 30 is a configuration diagram of an imaging device capable of temporally switching display of both a front side grating and a back side grating.

Figure 31:
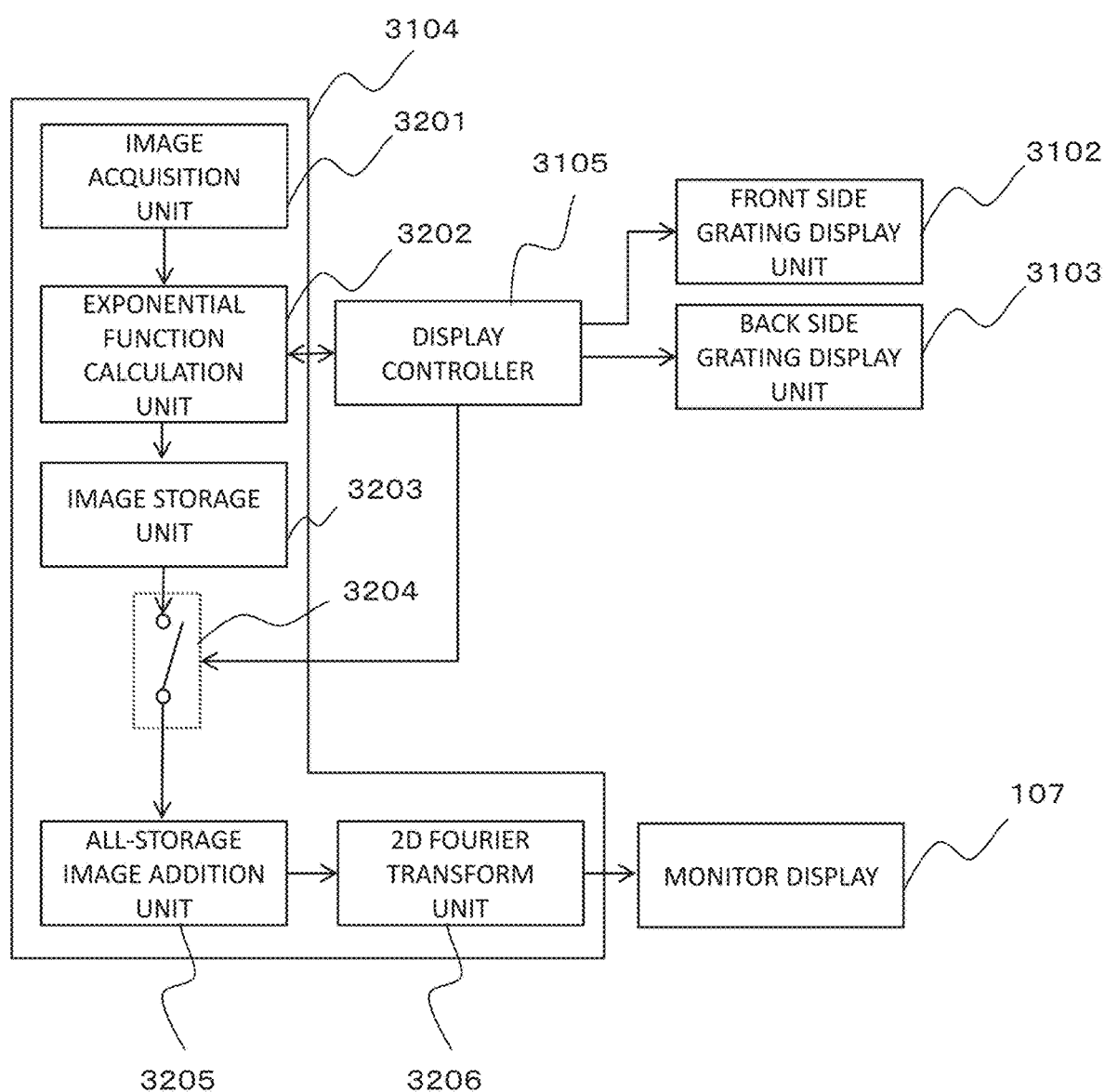
FIG. 31 is a block diagram of an image processing circuit.

FIG. 31 is a block diagram of an image processing circuit.

Figure 32:
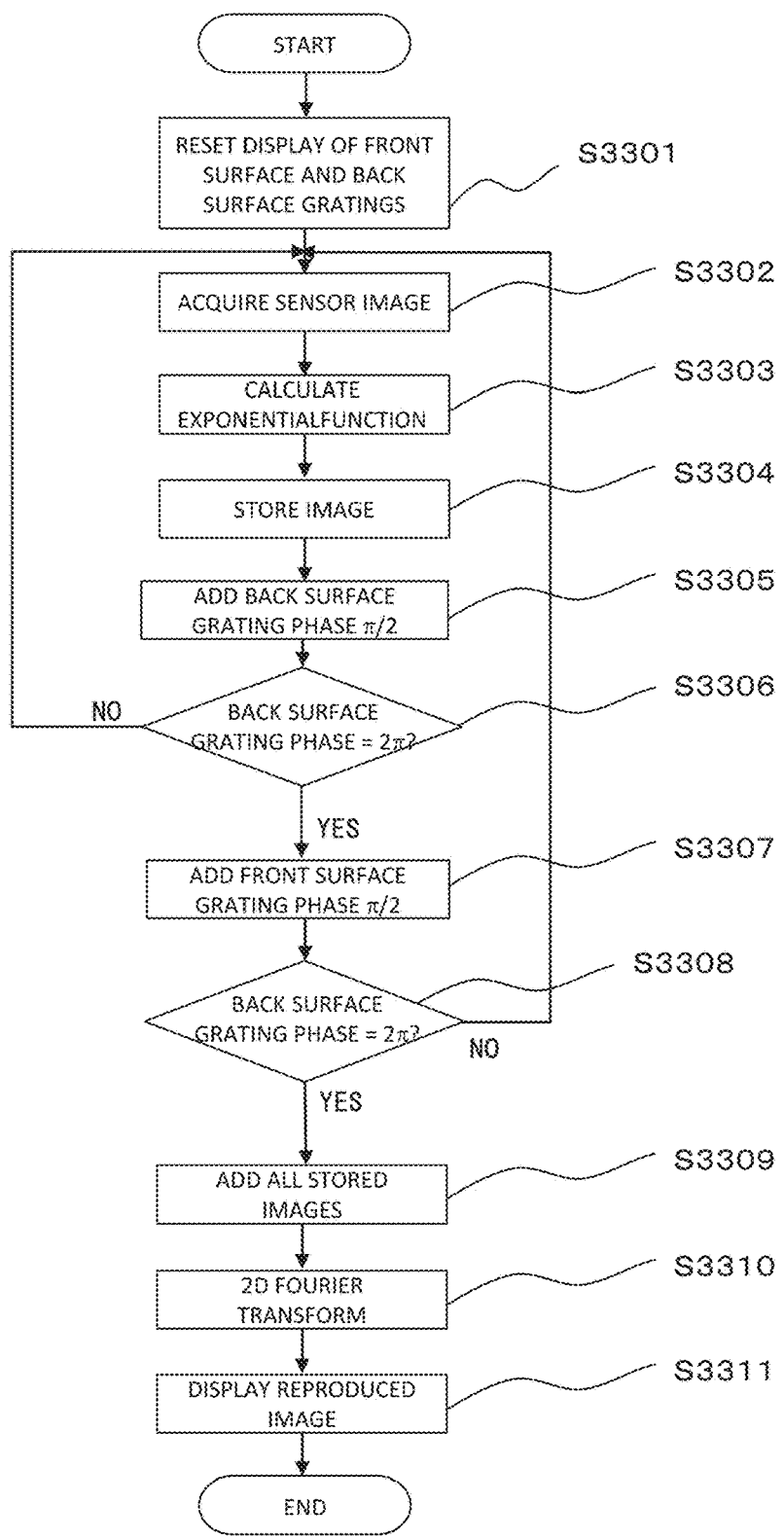
FIG. 32 is a flowchart illustrating processing of the image processing circuit.

FIG. 32 is a flowchart illustrating processing of the image processing circuit.

In the example of dividing the one-sided grating substrate illustrated in FIG. 21, a description has been given of the case of displaying the back side grating using the front side grating divided into a plurality of regions, the liquid crystal element, etc. However, here, a description will be given of a configuration capable of temporally switching display of both the front side grating and the back side grating using the liquid crystal element, etc.

An imaging device 3101 includes the image sensor 103, a front side grating display unit 3102, a back side grating display unit 3103, an image processing unit 3104, and a display controller 3015.

The front side grating display unit 3102 and the back side grating display unit 3103 can display a Fresnel zone plate whose phase of shading change is temporally changeable and the display thereof is controlled by the display controller 3105. The image capturing in the image processing unit 3104 and the display switching by the display controller 3105 are synchronously performed. In the image processing unit 3104, after noise removal from a plurality of captured images and processing for reconstruction are performed, a reference image in Fourier transform is reproduced and output to the monitor display 107, etc. The image processing unit 3104 includes an image acquisition unit 3201, an exponential function calculation unit 3202, an image storage unit 3203, a switch 3204, an all-storage image addition unit 3205, and a 2D Fourier transform unit 3206. The image acquisition unit 3201 is a unit for acquiring an image from the image sensor. The exponential function calculation unit 3202 is a unit for performing calculation of multiplying the difference between the phases of the front side grating pattern and the back side grating pattern as an exponential function. The image storage unit 3203 is a memory that temporarily stores a calculation result of the exponential function calculation unit 3202. The switch 3204 is a switch that is turned ON and OFF in response to a command from the display controller 3105. The all-storage image addition unit 3205 is a unit that adds image data of the image storage unit 3203. The 2D Fourier transform unit 3206 performs 2D Fourier transformation on the added image data.

Hereinafter, a description will be given of processing from image acquisition in this device to image reproduction including removal of noise of the moire fringe with reference to FIG. 31 and FIG. 32. Here, as an example, a phase serving as a reference for both the front side grating and the back side grating is set to 0, the phase is changed by $\pi/2$ for each step, and a reproduction processing is performed by combinations, each of which has four steps.

After resetting display of the front surface grating and the back surface grating (S3301), a sensor image is acquired by the image acquisition unit 3201 (S3302), the exponential function calculation unit 3202 multiplies the acquired image by a difference in phase between the front side grating pattern and the back side grating pattern as an exponential function (S3303), and the image is stored in the image storage unit 3203 (S3304). In the display controller 3105, a command is set to display a Fresnel zone plate added with a phase of $\pi/2$ on the front side grating display unit 3102, and a command is set to display a Fresnel zone plate added with a phase of $\pi/2$ on the back side grating display unit 3103 as necessary (S3305 to S3308). Here, when it is determined by the display controller that all images of phases necessary for reproduction have been captured, the switch 3204 is closed, and all images stored in the image storage unit 3203 are sent to the all-storage image addition unit 3205 and added (S3309). Since the moire fringe from which noise is removed is computed in this way, the image is Fourier-transformed by the 2D Fourier transform unit 3206 (S3310), and the reproduced image is displayed on the monitor display 107 (S3311).

According to this imaging device, display of the zone plate is temporally switched without dividing the region on both the front surface side grating and the back surface side grating, noise of the moire fringe is removed using a plurality of sensor images, and a reproduced image having excellent quality can be obtained. It is possible to switch the display unit an arbitrarily number of times when compared to a case in which display of the grating is fixed, and the number of times of switching of display can be varied according to a noise occurrence situation to obtain a reproduced image having excellent quality at all times.

In the above description, the liquid crystal element is used for both the front side grating and the back side grating. However, it suffices to display a Fresnel zone plate having a changed phase. For example, electrodes may be disposed in an annular shape, and a penetration ratio between the electrodes may be modulated to perform arbitrary display. In this way, it possible to eliminate an influence of a non-penetration portion having a grating shape caused by a fill factor, etc. in the liquid crystal element.

REFERENCE SIGNS LIST

101 Imaging device
102 Double-sided grating substrate
102a Grating substrate
103 Image sensor
104 Front side grating pattern
105 Back side grating pattern
106, 1201 Image processing circuit
107 Monitor display
201 Subject
901 Grating sensor integral substrate
1301 Point included in object
1302 Shadow of front side grating
1401 Liquid crystal layer
1402 Liquid crystal substrate
1403 Variable grating on front side substrate
2802 Viewing zone of imaging device
3101 Imaging device
3102 Front side grating display unit
3103 Back side grating display unit
3104 Image processing unit
3105 Display controller
3201 Image acquisition unit
3202 Exponential function calculation unit
3203 Image storage unit
3204 Switch
3205 All-storage image addition unit
3206 2D Fourier transform unit

The invention claimed is:

1. An imaging device comprising:
an image sensor that converts an optical image captured by a plurality of pixels arranged in an array on an imaging surface into an image signal and outputs the converted image signal;
a modulation unit provided on a light-receiving surface of the image sensor to modulate an intensity of light; and
an image processing unit that performs image processing on an output image output from the image sensor,
wherein the modulation unit has a grating substrate, and
a first grating pattern formed on a first surface of the grating substrate facing a surface close to the light-receiving surface of the image sensor,
the first grating pattern includes a plurality of concentric circles whose pitches are inversely proportional to a distance from an origin point of at least one set of reference coordinates,
the plurality of concentric circles does not overlap each other within the first grating pattern, and
the reference coordinates are symmetrically disposed with respect to a normal line at a center of the light-receiving surface.

2. The imaging device according to claim 1,
wherein the modulation unit has a second grating pattern corresponding to the first grating pattern formed on a second surface facing the first surface,
the second grating pattern includes a plurality of concentric circles whose pitches are inversely proportional to a distance from an origin point of at least one set of reference coordinates,
an origin point of reference coordinates of the first grating pattern coincides with an origin point of reference coordinates of the second grating pattern, and
the modulation unit intensity-modulates light penetrating the first grating pattern in the second grating pattern and outputs the intensity-modulated light to the image sensor.

3. The imaging device according to claim 2, wherein the second grating pattern is provided on a back surface of the grating substrate.

4. The imaging device according to claim 2,
wherein each of the first grating pattern and the second grating pattern is divided into a plurality of regions,
different concentric circular grating patterns are disposed between adjacent regions, and
combinations of phases of gratings of the plurality of regions in the first grating pattern and phases of the plurality of regions in the second grating pattern are disposed to overlap each other in a plurality of combinations.

5. The imaging device according to claim 2, wherein in the image processing, a sensor output signal based on combinations of all of P first grating patterns ($P \geq 2$, P: natural number) and Q second grating patterns ($Q \geq 2$, Q: natural number) is acquired and calculated, and a moire fringe component generated in light penetrating both grating patterns is enhanced.

6. The imaging device according to claim 5, wherein a phase shift amount of shading change of the first grating pattern is $(2\pi)/P$, and a phase shift amount of shading change of the second grating pattern is $(2\pi)/Q$.

7. The imaging device according to claim 2, wherein the second grating pattern or both the first grating pattern and the second grating pattern are realized by a liquid crystal element.

8. The imaging device according to claim 7, wherein the second grating pattern or both the first grating pattern and the second grating pattern are realized by an electrode disposed in an annular shape.

9. The imaging device according to claim 1, wherein the image processing unit performs a two-dimensional (2D) Fourier transform operation on the output image.

10. The imaging device according to claim 1,
wherein the image processing unit has an intensity modulation unit that performs a processing of virtually intensity-modulating light penetrating the first grating pattern,
the intensity modulation unit outputs the light penetrating the first grating pattern to the image sensor, and the image sensor outputs a capture image to the image processing unit, and
the intensity modulation unit performs a processing of intensity-modulating the light penetrating the first grating pattern based on the image captured by the image sensor using a virtual second grating pattern.

11. The imaging device according to claim 1, further comprising:
a liquid crystal element that displays the first grating pattern by an annular transparent electrode,
wherein the transparent electrode is allowed to selectively vary a light transmittance by dividing each cycle of the grating pattern into at least three or more concentric rings.

12. The imaging device according to claim 11, wherein in capturing of an image of one frame by the imaging device, each of states of voltages applied to at least three or more concentric annular transparent electrodes dividing each cycle of the grating pattern is changed at least once.

13. The imaging device according to claim 11,
wherein the intensity modulation unit modulates a light intensity by a virtual second grating pattern, and
when an image of one frame is captured, a phase of the second grating pattern is changed with respect to each first grating pattern in which a light intensity is made different by the liquid crystal element, and images of all combinations are synthesized and calculated, thereby performing calculation of extracting moire fringe components of a first grating and a second grating.

14. The imaging device according to claim 13,
wherein phases of shading changes of the first grating pattern and the second grating pattern are equal to each other, and
in the image processing, two output images corresponding to a case in which a phase of the shading change is not shifted and a case in which the phase is shifted by $\pi/2$ are averaged.

15. The imaging device according to claim 13, wherein a phase difference in shading change between the first grating pattern and the second grating pattern is 0 or $\pi/2$, and in the image processing, a calculation result of the phase difference 0 and a calculation result of the phase difference $\pi/2$ are assigned to a real part and an imaginary part or an imaginary part and a real part, respectively, and added.

16. The imaging device according to claim 1, wherein the first grating pattern is divided into a plurality of regions, a different concentric circular grating pattern is disposed for each of the regions, and reference coordinates of respective grating patterns are symmetrically disposed with respect to the normal line at the center of the light-receiving surface.

17. The imaging device according to claim 16, wherein each of concentric circular grating patterns obtained by dividing the first grating pattern into the plurality of regions mutually has the same pitch distribution with respect to a distance from an origin point of reference coordinates and has a different phase in grating arrangement.

18. The imaging device according to claim 16,
wherein the modulation unit has a second grating pattern corresponding to the first grating pattern formed on a second surface facing the first surface,
the second grating pattern includes a plurality of concentric circles whose pitches are inversely proportional to a distance from an origin point of at least one set of reference coordinates,
an origin point of reference coordinates of the first grating pattern coincides with an origin point of reference coordinates of the second grating pattern, and
calculation of extracting moire fringe components of the first grating and the second grating is performed by synthesizing and calculating images of all the regions.

19. The imaging device according to claim 18, wherein a phase of grating arrangement for each of the divided regions is the same exclusively in an X direction or a Y direction in either one or both of the first grating pattern and the second grating pattern.

20. The imaging device according to claim 16,
wherein the intensity modulation unit modulates a light intensity by a virtual second grating pattern, and
when an image of one frame is captured, a phase of the second grating pattern is changed, and calculation of extracting moire fringe components of a first grating and a second grating is performed by synthesizing and calculating images of all the regions.

* * * * *